(12) United States Patent
Soyano et al.

(10) Patent No.: US 10,784,214 B2
(45) Date of Patent: Sep. 22, 2020

(54) SEMICONDUCTOR MODULE, ELECTRIC AUTOMOBILE AND POWER CONTROL UNIT

(71) Applicant: FUJI ELECTRIC CO., LTD., Kanagawa (JP)

(72) Inventors: Shin Soyano, Shiojiri (JP); Hayato Nakano, Matsumoto (JP); Keiichi Higuchi, Matsumoto (JP); Akihiro Osawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/261,521

(22) Filed: Jan. 29, 2019

(65) Prior Publication Data

US 2019/0157221 A1 May 23, 2019

Related U.S. Application Data

(63) Continuation of application No. PCT/JP2018/000369, filed on Jan. 10, 2018.

(30) Foreign Application Priority Data

Feb. 6, 2017 (JP) ................................ 2017-019963

(51) Int. Cl.
*H01L 23/64* (2006.01)
*H01L 23/495* (2006.01)
(Continued)

(52) U.S. Cl.
CPC ............ *H01L 23/645* (2013.01); *H01L 23/48* (2013.01); *H01L 23/4951* (2013.01);
(Continued)

(58) Field of Classification Search
CPC .................... H01L 23/49537; H01L 23/49575
See application file for complete search history.

(56) References Cited

U.S. PATENT DOCUMENTS

| | | | |
|---|---|---|---|
| 9,806,009 B2* | 10/2017 | Fujino | H01L 23/48 |
| 10,074,639 B2* | 9/2018 | Male | H01L 23/49575 |
| 10,099,574 B2* | 10/2018 | Lei | H01L 23/49575 |
| 10,573,581 B2* | 2/2020 | Ho | H01L 23/49537 |
| 10,615,107 B2* | 4/2020 | Stiegler | H01L 24/49 |

(Continued)

FOREIGN PATENT DOCUMENTS

| | | | |
|---|---|---|---|
| JP | 2004022960 A | 1/2004 | |
| JP | 2007266608 A | 10/2007 | |

(Continued)

OTHER PUBLICATIONS

International Search Report for International Patent Application No. PCT/JP2018/000369, issued by the Japan Patent Office dated Mar. 20, 2018.

*Primary Examiner* — David A Zarneke

(57) ABSTRACT

A semiconductor module includes: a first lead frame connected to a plurality of semiconductor chips in a first arm circuit; a second lead frame connected to a plurality of semiconductor chips in a second arm circuit; a first main terminal connected to the first lead frame; and a second main terminal connected to the second lead frame, wherein each of the first lead frame and second lead frame has a facing part, a first terminal connection portion connected to the first main terminal is provided at a first end portion of the first lead frame, a second terminal connection portion connected to the second main terminal is provided at a second end portion of the second lead frame, and the first terminal connection portion and second terminal connection portion are arranged on opposite sides when viewed from the facing parts of the first lead frame and second lead frame.

19 Claims, 20 Drawing Sheets

(51) Int. Cl.
*H02K 11/33* (2016.01)
*H01L 23/00* (2006.01)
*H01L 25/07* (2006.01)
*H01L 23/48* (2006.01)
*H01L 25/18* (2006.01)
*H02M 7/48* (2007.01)

(52) U.S. Cl.
CPC .... *H01L 23/4952* (2013.01); *H01L 23/49537* (2013.01); *H01L 23/49562* (2013.01); *H01L 23/49568* (2013.01); *H01L 23/49575* (2013.01); *H01L 23/562* (2013.01); *H01L 25/07* (2013.01); *H01L 25/18* (2013.01); *H02K 11/33* (2016.01); *H02M 7/48* (2013.01); *H01L 2224/49111* (2013.01); *H01L 2924/19107* (2013.01)

(56) References Cited

U.S. PATENT DOCUMENTS

| | | | |
|---|---|---|---|
| 10,636,740 B2 * | 4/2020 | Hori | H01L 23/492 |
| 2007/0228413 A1 | 10/2007 | Bayerer | |
| 2015/0115423 A1 | 4/2015 | Yamashita | |
| 2017/0006721 A1 | 1/2017 | Soyano | |
| 2017/0042053 A1 | 2/2017 | Soyano | |

FOREIGN PATENT DOCUMENTS

| | | | | |
|---|---|---|---|---|
| JP | 2014022580 A | | 2/2014 | |
| JP | 2017017195 A | | 1/2017 | |
| JP | 2017037892 A | | 2/2017 | |
| WO | WO-2013118275 A1 | * | 8/2013 | ......... H01L 23/4334 |
| WO | 2013171996 A1 | | 11/2013 | |

* cited by examiner

SEMICONDUCTOR MODULE, ELECTRIC AUTOMOBILE AND POWER CONTROL UNIT

The contents of the following Japanese patent application(s) are incorporated herein by reference:
  NO. 2017-019963 filed in JP on Feb. 6, 2017, and
  NO. PCT/JP2018/000369 filed on Jan. 10, 2018.

BACKGROUND

1. Technical Field

The present invention relates to a semiconductor module, an electric automobile and a power control unit.

2. Related Art

In a semiconductor module that houses a plurality of power semiconductor elements, a structure is known that connects a bent current connection component to a semiconductor element (for example, refer to Patent Document 1).

Patent Document 1: Japanese Patent Application Publication No. 2007-266608

SUMMARY

In a semiconductor module, it is desirable to reduce an internal inductance.

A first aspect of the present invention provides a semiconductor module. The semiconductor module may comprise a first arm circuit and a second arm circuit. The semiconductor module may comprise a plurality of semiconductor chips, a first lead frame, a second lead frame, a first main terminal and a second main terminal. The plurality of semiconductor chips may be included in each of the first arm circuit and the second arm circuit. The first lead frame may be connected to the plurality of semiconductor chips in the first arm circuit. The second lead frame may be connected to the plurality of semiconductor chips in the second arm circuit. The first main terminal may be connected to the first lead frame. The second main terminal may be connected to the second lead frame. Each of the first lead frame and the second lead frame may have a facing part.
A first end portion of the first lead frame may have a first terminal connection portion. A first terminal connection portion may be connected to the first main terminal. A second end portion of the second lead frame may have a second terminal connection portion. A second terminal connection portion may be connected to the second main terminal. The first terminal connection portion and the second terminal connection portion may be arranged on opposite sides when viewed from the facing parts of the first lead frame and the second lead frame.

A direction of a current that flows in the first lead frame when the semiconductor chip included in an upper arm circuit is switched to an ON state may be opposite to a direction of a current that flows in the second lead frame when the semiconductor chip included in a lower arm circuit is switched to an ON state.

A chip connection portion that is connected to the plurality of semiconductor chips in the first lead frame, and a chip connection portion that is connected to the plurality of semiconductor chips in the second lead frame may be arranged in parallel to each other in a top view.

The first lead frame may have a first plate-shaped portion and a first extension portion. The first extension portion may: be formed at an end side in the first plate-shaped portion at which the first plate-shaped portion faces the second lead frame; and extend in an upward direction or downward direction. The second lead frame may have a second plate-shaped portion and a second extension portion. The second extension portion may: be formed at an end side in the second plate-shaped portion at which the second plate-shaped portion faces the first lead frame; and extend in a direction to face the first extension portion.

The first lead frame may further have a first facing portion. The first facing portion may be connected to the first extension portion. The first facing portion may have a plate shape that is arranged to face the first plate-shaped portion.

The second lead frame may further have a second facing portion. The second facing portion may be connected to the second extension portion. The second facing portion may be plate-shaped that is arranged to face the second plate-shaped portion.

The first lead frame may have the first plate-shaped portion. The second lead frame may have the second plate-shaped portion and an overlapping portion. The second plate-shaped portion may be arranged so as not to overlap the first plate-shaped portion in a top view. The overlapping portion may be connected to the second plate-shaped portion. The overlapping portion may be arranged to overlap the first plate-shaped portion.

The first lead frame may have the first extension portion, the first facing portion, a plurality of first chip connection portions. The first extension portion may: be formed at an end side in the first plate-shaped portion at which the first plate-shaped portion faces the second lead frame; and extend in the upward direction or downward direction. The first facing portion may be connected to the first extension portion. The first facing portion may have a plate shape that is arranged to face the first plate-shaped portion. The plurality of first chip connection portions may connect the first plate-shaped portion or the first facing portion to the plurality of semiconductor chips.

The second lead frame may have a plurality of second chip connection portions. The plurality of second chip connection portions may connect the second plate-shaped portion to the plurality of semiconductor chips.

The second lead frame may have a second extension portion. The second extension portion may couple the second plate-shaped portion to the overlapping portion. In the second extension portion, a cutout may be formed to span from an end side thereof closer to the second main terminal to a position at which the cutout faces the semiconductor chip that is among the plurality of semiconductor chips and is closest to the second main terminal.

The first lead frame may have the first plate-shaped portion and the plurality of chip connection portions. The first plate-shaped portion may be connected to the first main terminal. The plurality of chip connection portions may be connected to the plurality of semiconductor chips. The plurality of chip connection portions may be thinner than the first plate-shaped portion.

In the first lead frame, the first terminal connection portion connected to the first main terminal may be thicker than a part connected to the plurality of semiconductor chips.

The first lead frame may have the plurality of first chip connection portions. The plurality of first chip connection portions may be connected to the plurality of semiconductor chips. The first extension portion may be thicker than the first chip connection portion.

The plurality of semiconductor chips may include a plurality of reverse-conducting insulated gate bipolar transistors. The first lead frame may include a first intermediate portion. The first intermediate portion may be connected to emitter terminals of the plurality of semiconductor chips. The plurality of semiconductor chips may be included in the first arm circuit. The second lead frame may further have a second intermediate portion. The second intermediate portion may be connected to emitter terminals of the plurality of semiconductor chips. The plurality of semiconductor chips may be included in the second arm circuit. The first intermediate portion of the first lead frame may face the second intermediate portion of the second lead frame at an interval therebetween. The first intermediate portion of the first lead frame may be arranged to be point-symmetric to the second intermediate portion of the second lead frame about a middle of the interval in a top view.

The first slit portion may be formed in the first lead frame. The first slit portion may be formed along a longitudinal direction of the first intermediate portion in the first lead frame. The second slit portion may be formed in the second lead frame. The second slit portion may be formed along a longitudinal direction of the second intermediate portion in the second lead frame.

A length of the first slit portion in the longitudinal direction may be longer than two thirds of a length of the first intermediate portion in the first lead frame in the longitudinal direction. A length of the second slit portion in the longitudinal direction may be longer than two thirds of a length of the second intermediate portion in the second lead frame in the longitudinal direction.

The first slit portion may be formed to span from an end side closer to the first main terminal. The second slit portion may be formed to span from an end side closer to the second main terminal.

A second aspect of the present invention provides an electric automobile. The electric automobile may comprise the semiconductor module.

A third aspect of the present invention provides an electric automobile. The electric automobile may comprise a semiconductor module. A fourth aspect of the present invention provides a power control unit. The power control unit may comprise the semiconductor module.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the present invention will be described. However, the following embodiments do not limit the invention according to the claims. In addition, all the combinations of the features described in the embodiments are not necessarily essential to means provided by aspects of the invention.

In the present specification, a technical matter will be described with orthogonal coordinate axes of X-axis, Y-axis and Z-axis. The orthogonal coordinate axes are only to specify relative positions of components, and shall not limit them to specific directions. For example, the Z-axis shall not exclusively indicate a height direction relative to the ground. Note that, a +Z-axis direction and a −Z-axis direction are directions opposite to each other. When the Z-axis direction is described without description of positive and negative, it means a direction parallel to +Z-axis and −Z-axis.

Figure 1:
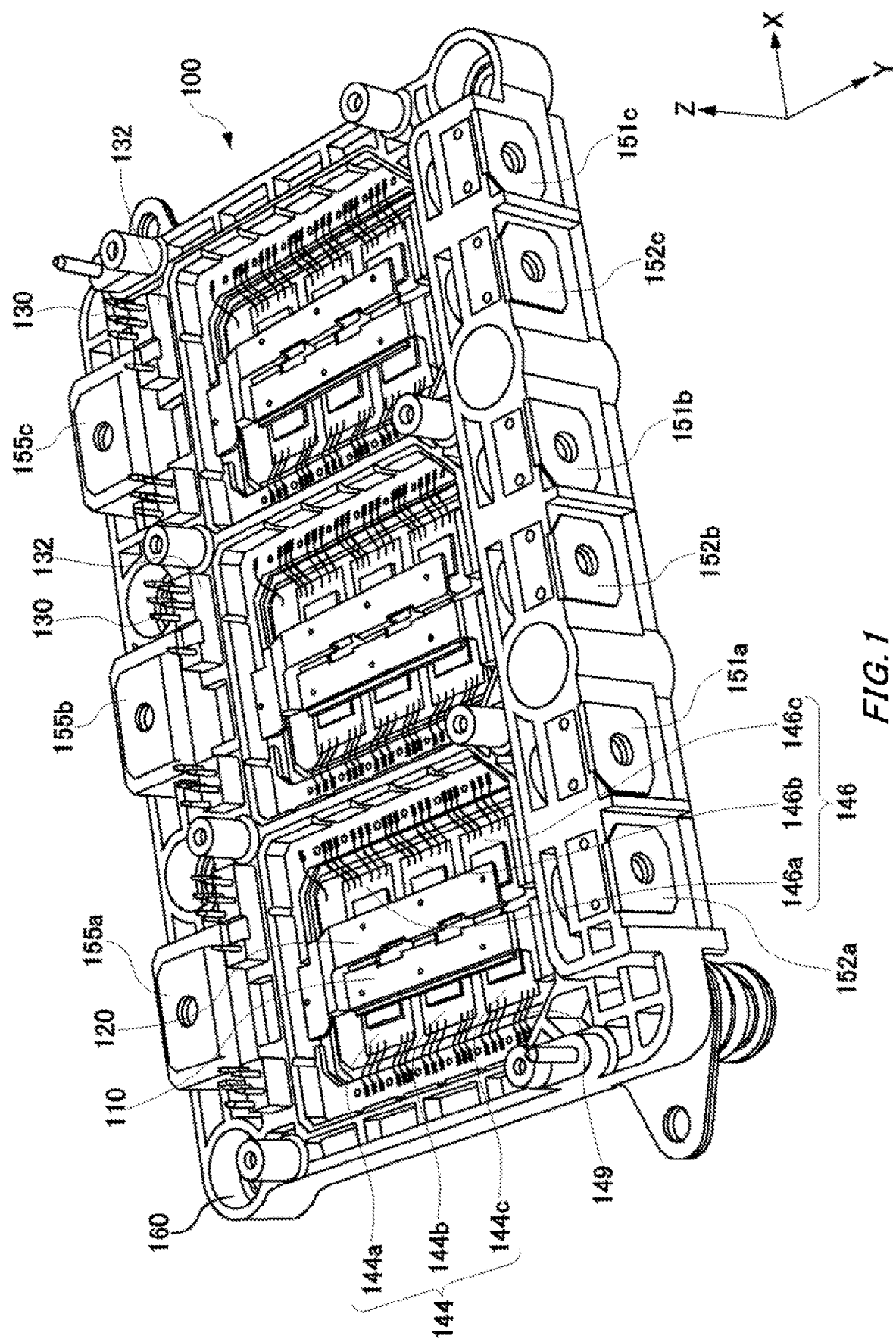
FIG. 1 is a perspective view showing an overview of a semiconductor module 100 in one embodiment of the present invention.

FIG. 1 is a perspective view showing an overview of a semiconductor module 100 in one embodiment of the present invention. The semiconductor module 100 houses an electronic circuit of, for example, a plurality of semiconductor chips 144a, 144b and 144c, and a plurality of semiconductor chips 146a, 146b and 146c therein. The semiconductor module 100 of the present example may comprise a resin case 160 that houses the plurality of semiconductor chips 144a, 144b and 144c, and the plurality of semiconductor chips 146a, 146b and 146c. In this regard, note that the resin case 160 may be omitted if needed. A stacked substrate is provided in a housing part of the semiconductor module 100. The semiconductor chips 144a, 144b and 144c are provided on the stacked substrate.

The plurality of semiconductor chips 144a, 144b and 144c constitute a lower arm circuit 144. The plurality of semiconductor chips 146a, 146b and 146c constitutes an upper arm circuit 146. The lower arm circuit 144 is a switch circuit that is electrically connected between a negative electrode of a main power supply and an AC output terminal. The upper arm circuit 146 is a switch circuit that is electrically connected between a positive electrode of the main power supply and the AC output terminal. The semiconductor module 100 may constitute am inverter circuit. One circuit of the lower arm circuit 144 and the upper arm circuit 146 is referred to as a "first arm circuit," and the other circuit is referred to as a "second arm circuit."

The plurality of semiconductor chips 144a, 144b and 144c that constitute the lower arm circuit 144 may be arrayed along the Y-axis. Similarly, the plurality of semiconductor chips 146a, 146b and 146c that constitute the upper arm circuit 146 may also be arrayed along the Y-axis. The plurality of semiconductor chips 144a, 144b and 144c and the plurality of semiconductor chips 146a, 146b and 146c may be arrayed to face each other at different positions on the X-axis. In this regard, the semiconductor chips 144a, 144b and 144c and so on may not necessarily be arrayed in a line. The adjacent semiconductor chips 144a, 144b may be arrayed in a staggered manner such that positions of the semiconductor chips 144a, 144b in the X direction are changed alternately.

The lower arm circuit 144 and the upper arm circuit 146 are arranged in pairs. In the present example, three sets of the lower arm circuits 144 and three sets of the upper arm circuits 146 are arranged. In this regard, the number of the circuits is not limited to this case.

The semiconductor module 100 comprises a lead frame for the lower arm circuit and a lead frame for the upper arm circuit. One of the lead frame for the lower arm circuit and the lead frame for the upper arm circuit is a first lead frame, and the other is a second lead frame. A case where the lead frame for the lower arm circuit is a first lead frame 110, and where the lead frame for the upper arm circuit is a second lead frame 120 is described as an example. In this regard, the first lead frame 110 is not intended to be limited to the lead frame for the lower arm circuit, and the second lead frame 120 is not intended to be limited to the lead frame for the upper arm circuit. The lead frame for the upper arm circuit may be the first lead frame, and the lead frame for the upper arm circuit may be the second lead frame.

In the present example, the three sets of the first lead frames 110 and the three sets of the second lead frames are provided corresponding to three sets of the lower arm circuits 144 and three sets of the upper arm circuits 146. In this regard, the numbers of the first lead frames 110 and of the second lead frame 120 are not limited. The first lead frame 110 and the second lead frame 120 may be formed of a metal or another conductive material. The first lead frame 110 may be integrally formed, or may be formed by coupling of a plurality of component members. The second lead frame 120 is also similar.

The first lead frame 110 is connected to the plurality of semiconductor chips 144a, 144b and 144c in the lower arm circuit 144.

The second lead frame 120 is connected to the plurality of semiconductor chips 146a, 146b and 146c in the upper arm circuit 146.

The first lead frame 110 and the second lead frame 120 each have a surface arranged to face each other. The word "face" may mean plane-symmetric surfaces about a plane between the first lead frame and the second lead frame. The plane between the first lead frame and the second lead frame may be a YX plane, and may be a YZ plane. A top view means a case viewed from an upper side. A side in which the first lead frame 110 is provided on the basis of the semiconductor chips 144a, 144b and 144c is defined as the upper side, and the opposite side from the upper side is defined as a lower side. Accordingly, in the present example, +Z-axis direction corresponds to the upper side.

In the present example, a part connected to the plurality of semiconductor chips 144a, 144b and 144c in the first lead frame 110 is arranged in parallel to a part connected to the plurality of semiconductor chips 146a, 146b and 146c in the second lead frame 120 in a top view.

A plurality of main terminals are fixed on the surface of the resin case 160. Specifically, the semiconductor module 100 comprises a U terminal 155a, a V terminal 155b and a W terminal 155c. The U terminal 155a, the V terminal 155b and the W terminal 155c each may be an AC output terminal, especially a three-phase output terminal. Also, the semiconductor module 100 may comprise P terminals 151a, 151b and 151c (collectively referred to as 151) and N terminals 152a, 152b and 152c (collectively referred to as 152) on the surface of the resin case 160. The P terminal 151 is an input terminal that can be connected to the positive electrode of the main power supply, and the N terminal 152 is an input terminal that can be connected to the negative electrode of the main power supply. Also, a terminal pin 130 and so on may be provided on a resin case 160 surface with a resin block 132.

The U terminal 155a, the V terminal 155b, the W terminal 155c, the P terminal 151 and the N terminal 152 are the main terminals. In the present example, the P terminal 151 is a positive electrode terminal of a DC power supply. The N terminal 152 is a negative electrode of the DC power supply. The P terminal 151 and the N terminal 152 may be arranged along one side surface of the resin case 160 (side surface on a +Y-axis direction side). On the other hand, the U terminal 155a, the V terminal 155b, and the W terminal 155c that are the AC output terminals may be arranged along the other side surface of the resin case 160 facing the one side surface described above (side surface on a −Y-axis direction side). The first lead frame 110 is connected to the semiconductor chips 144a, 144b and 144c. One end portion of the first lead frame 110 (end portion in the +Y-axis direction) is connected to the N terminal 152 that is one of the main terminals. On the other hand, an end portion of the second lead frame 120 (end portion in the −Y-axis direction) is connected to the U terminal 155a (or the V terminal 155b or the W terminal 155c) that is one of the main terminals. The end portion of the second lead frame 120 described above is the end portion on an opposite side (−Y-axis direction) from an end portion in the +Y-axis direction in which the first lead frame 110 is connected to the N terminal 152.

Also, the semiconductor module 100 may comprise a chiller at a bottom on a rear surface side thereof. A refrigerant can be supplied to the chiller from the outside. Each chip of the semiconductor chip 144a and so on, the first lead frame 110 and the second lead frame 120 may be sealed by a resin. The resin may be a sealing material of a gel such as silicone gel, a silicone resin, an epoxy resin or the like. The sealing material may include a filler.

Figure 2:
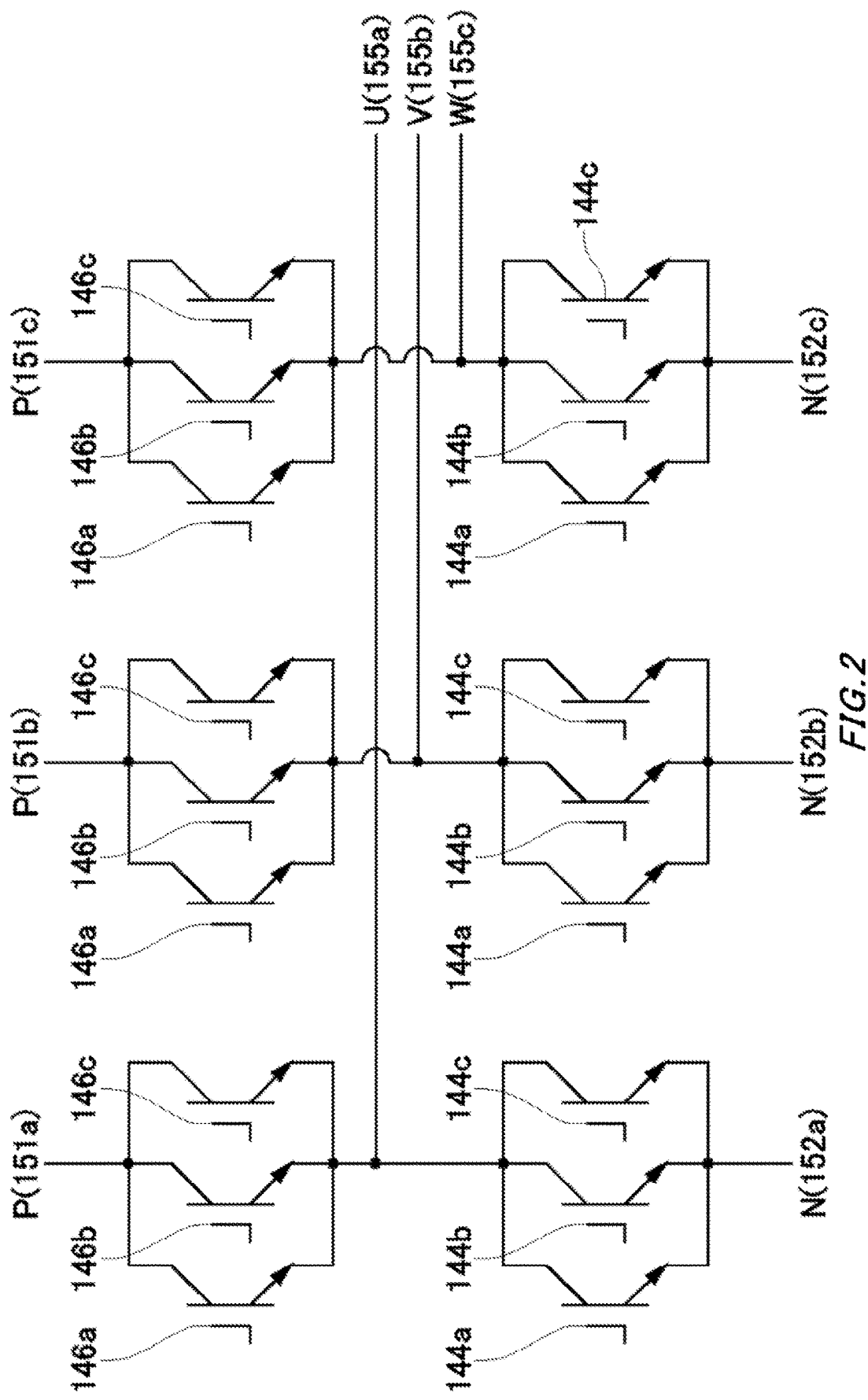
FIG. 2 is a circuit diagram showing an overview of a main circuit of the semiconductor module 100.

FIG. 2 is a circuit diagram showing an overview of a main circuit of the semiconductor module 100. This example shows a three-phase inverter. The three-phase inverter has three sets of the lower arm circuits 144 and three sets of the upper arm circuits 146. Each lower arm circuit 144 has a set of three semiconductor chips, the semiconductor chips 144a, 144b and 144c. The three semiconductor chips 144a, 144b and 144c in each lower arm circuit 144 are electrically connected in parallel. Similarly, each upper arm circuit 144 has a set of three semiconductor chips, semiconductor chips 146a, 146b and 146c. The three semiconductor chips 146a, 146b and 146c in each upper arm circuit 146 are electrically connected in parallel.

The semiconductor chips 144a, 144b and 144c, 146a, 146b and 146c each may be a vertical power semiconductor element. The vertical power semiconductor element may include an IGBT chip that comprises, for example, an emitter electrode, a control electrode pad, and a collector electrode opposite the emitter electrode across a substrate. The power semiconductor element may include an RC-IGBT (reverse-conducting IGBT) having a IGBT region and a FWD region. The control electrode pad may include a gate metal layer or a sense-emitter electrode. Also, the control electrode pad may an anode electrode or a cathode electrode for temperature measurement. The substrate for the semiconductor chip may include silicon or silicon carbide.

The corresponding lower arm circuit 144 and the upper arm circuit 146 may constitute a leg in pairs. The illustrated example includes three legs. In each leg, the P terminal 151 is electrically connected to each collector electrode of the semiconductor chips 146a, 146b and 146c included in the upper arm circuit 146. The N terminal 152 is electrically connected to each emitter electrode of the semiconductor chips 144a, 144b and 144c included in the lower arm circuit 144. Also, each emitter electrode of the semiconductor chips 146a, 146b and 146c in the upper arm circuit 146, and each collector electrode of the semiconductor chips 144a, 144b and 144c in the lower arm circuit 144 are electrically connected to the U terminal 155a and so on. These electrical connections may be implemented through the first lead frame 110, the second lead frame 120, a circuit formed in a metal foil on the stacked substrate, and an internal wiring terminal 149 and so on. Also, the control electrode pad may be connected to an external control circuit through a printed board, and a terminal pin 130 and so on.

Figure 3:
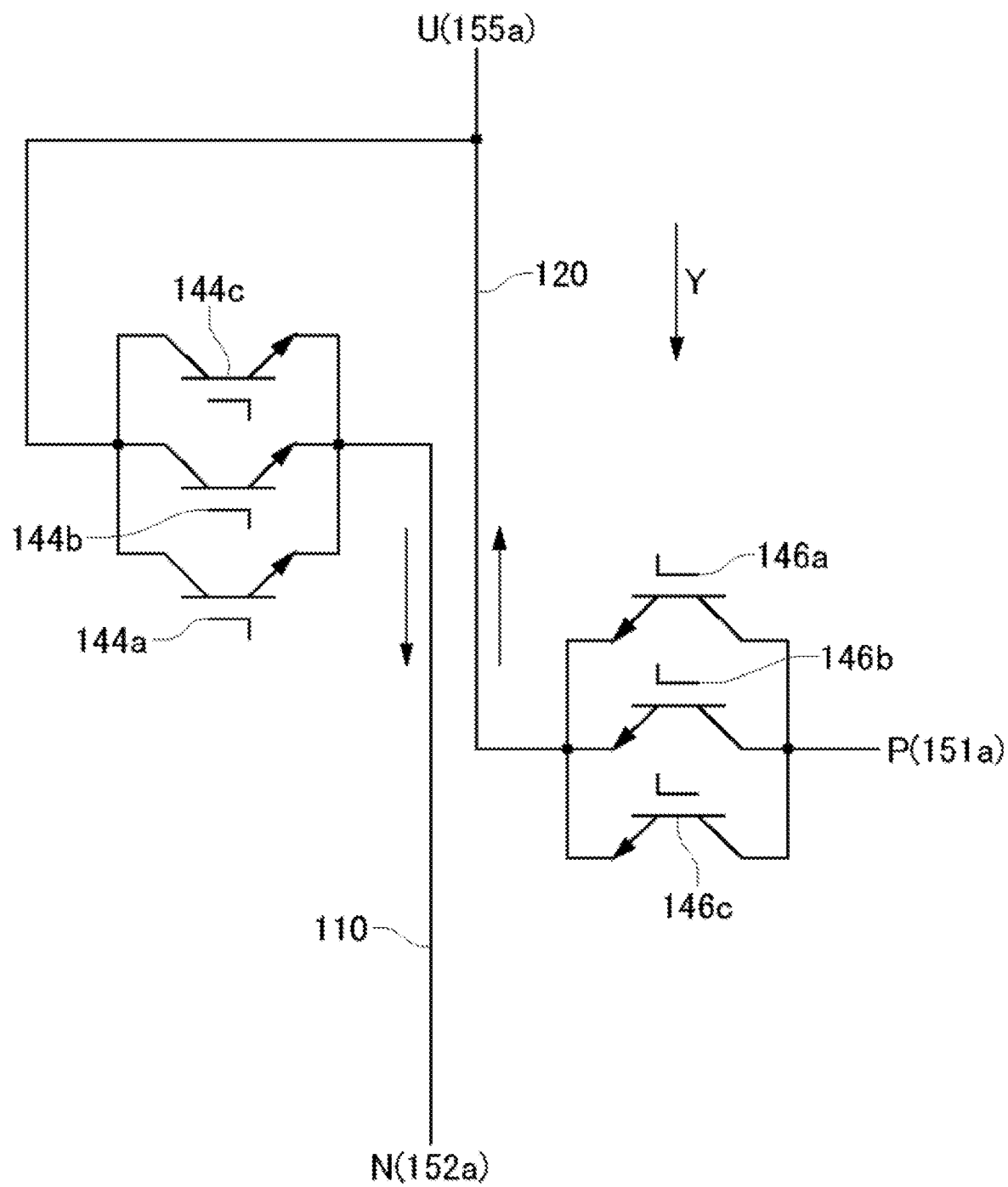
FIG. 3 is a circuit diagram showing one example of a direction of current in a main circuit.

FIG. 3 is a circuit diagram showing one example of a direction of current in a main circuit. FIG. 3 shows one leg out of the circuit. The first lead frame 110 is used for an electrical connection between each emitter electrode of the semiconductor chips 144a, 144b and 144c in the lower arm circuit 144 and the N terminal 152a. The second lead frame 120 is used for an electrical connection between each emitter electrode of the semiconductor chips 146a, 146b and 146c in the upper arm circuit 146 and the U terminal 155a and so on. An end portion of the second lead frame 120 is connected to the U terminal 155a in the −Y-axis direction. On the other hand, an end portion of the first lead frame 110 is connected to the N terminal 152 in the +Y-axis direction.

In the second lead frame 120, a current flows from the emitter electrodes of the semiconductor chips 146a, 146b and 146c to the U terminal 155. In the present example, a current flows in the second lead frame 120 in the −Y-axis direction. On the other hand, in the first lead frame 110, a current flows from the emitter electrodes of the semiconductor chips 144a, 144b and 144c to the N terminal 152a. In the present example, a current flows in the first lead frame 110 in the +Y-axis direction.

Accordingly, in the semiconductor module 100 of the present example, a direction of the current that flows in the second lead frame 120 when the semiconductor chips 146a, 146b and 146c included in the upper arm circuit 146 are switched to an ON state becomes opposite to a direction of the current that flows in the first lead frame 110 when the semiconductor chips 144a, 144b and 144c included in the lower arm circuit 144 are switched to an ON state. This can cancel inductance and induction field to be generated by the first lead frame 110 and the second lead frame 120. Accordingly, an arrangement of the first lead frame 110 and the second lead frame 120 in parallel and adjacent to each other can reduce the inductance to be generated due to the currents that flow in the first lead frame 110 and the second lead frame 120.

According to the semiconductor module 100 in the present embodiment, it is thermally advantageous as compared to a case that the semiconductor chips 144a, 144b and 144c and so on are circuit-wired by wire bonding of aluminum or the like. Also, since the number of wirings to be used in the wire bonding can be reduced as compared to a case where a main circuit wiring is routed by the bonding, facility cost and man-hour can be reduced. As compared to the case that is circuit-wired by the wire bonding, a wiring region in the wire bonding can be lessened, so that miniaturization of the semiconductor module 100 can be achieved.

Figure 4:
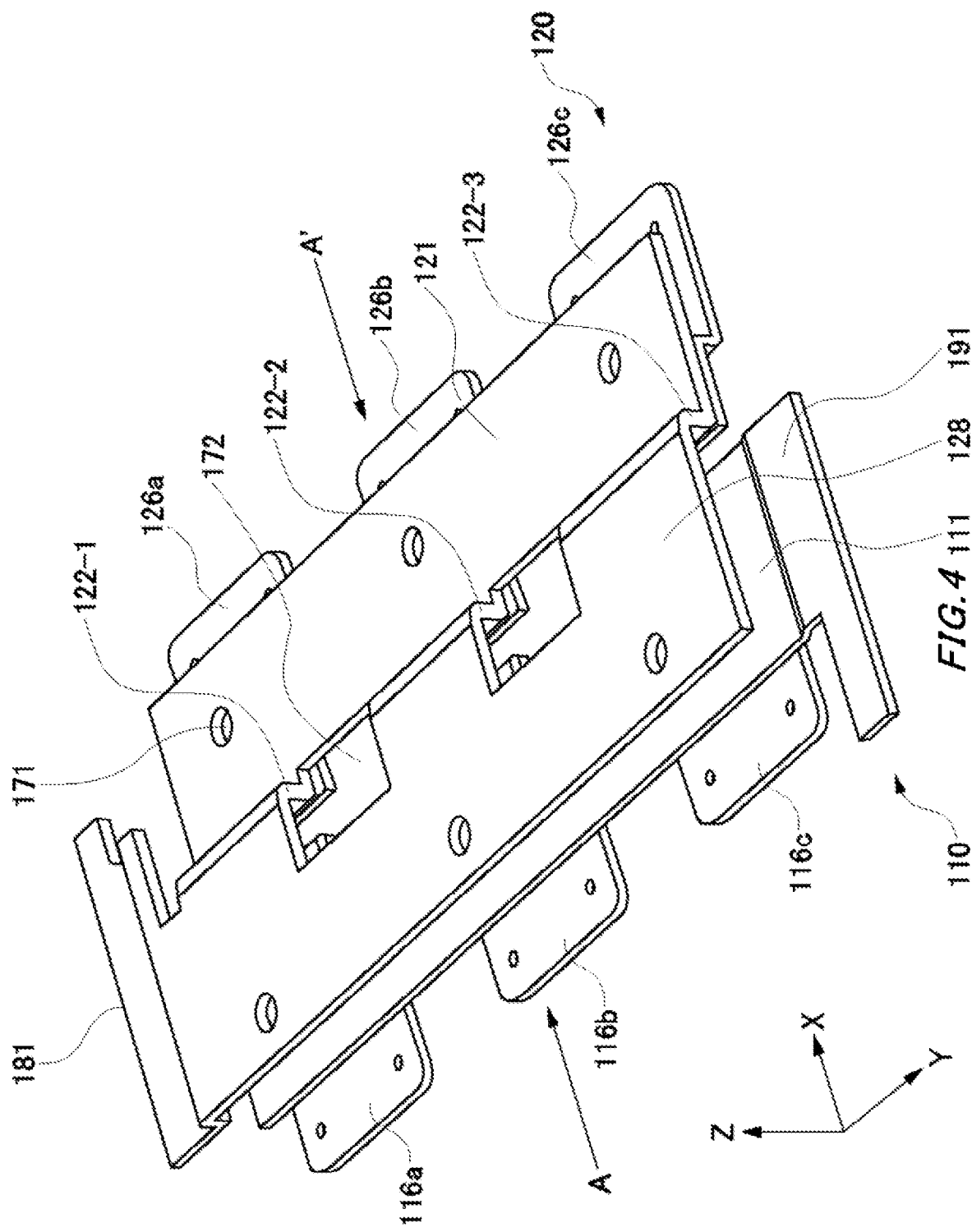
FIG. 4 shows an arrangement example of a first lead frame 110 and a second lead frame 120.
Figure 5:
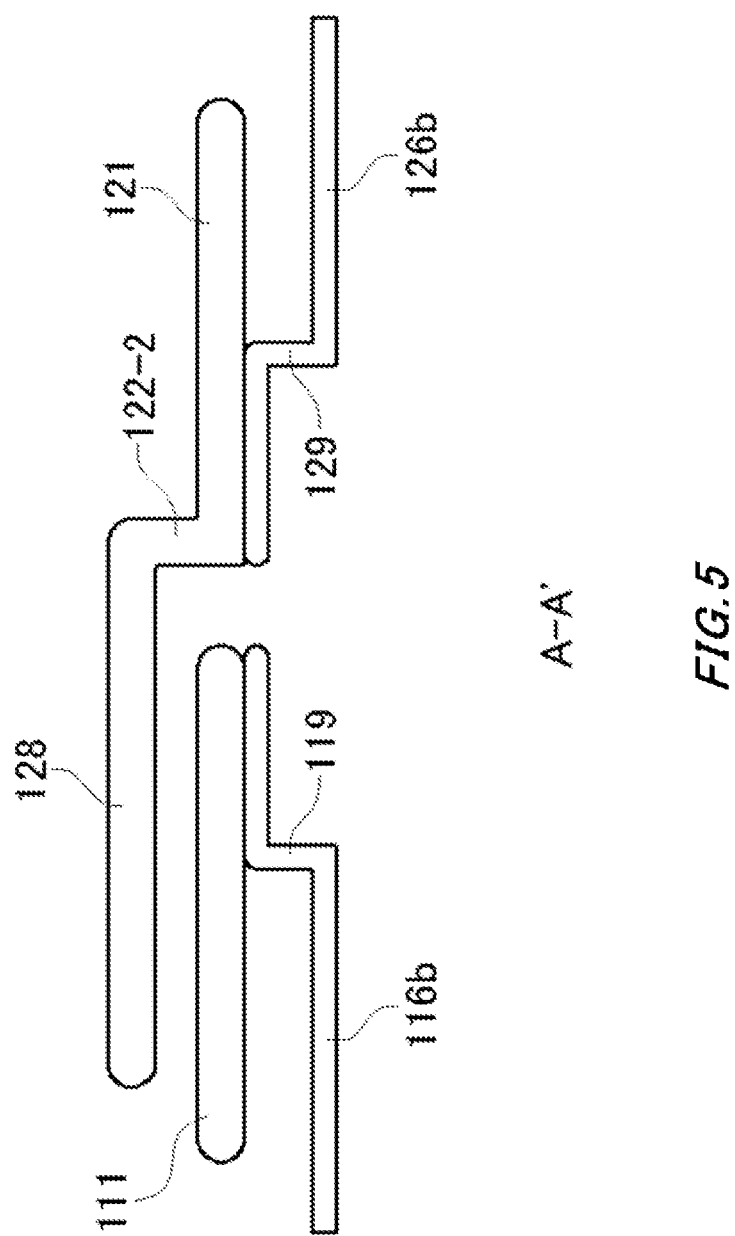
FIG. 5 shows a cross-section in the arrangement example of the first lead frame 110 and the second lead frame 120.
Figure 6:
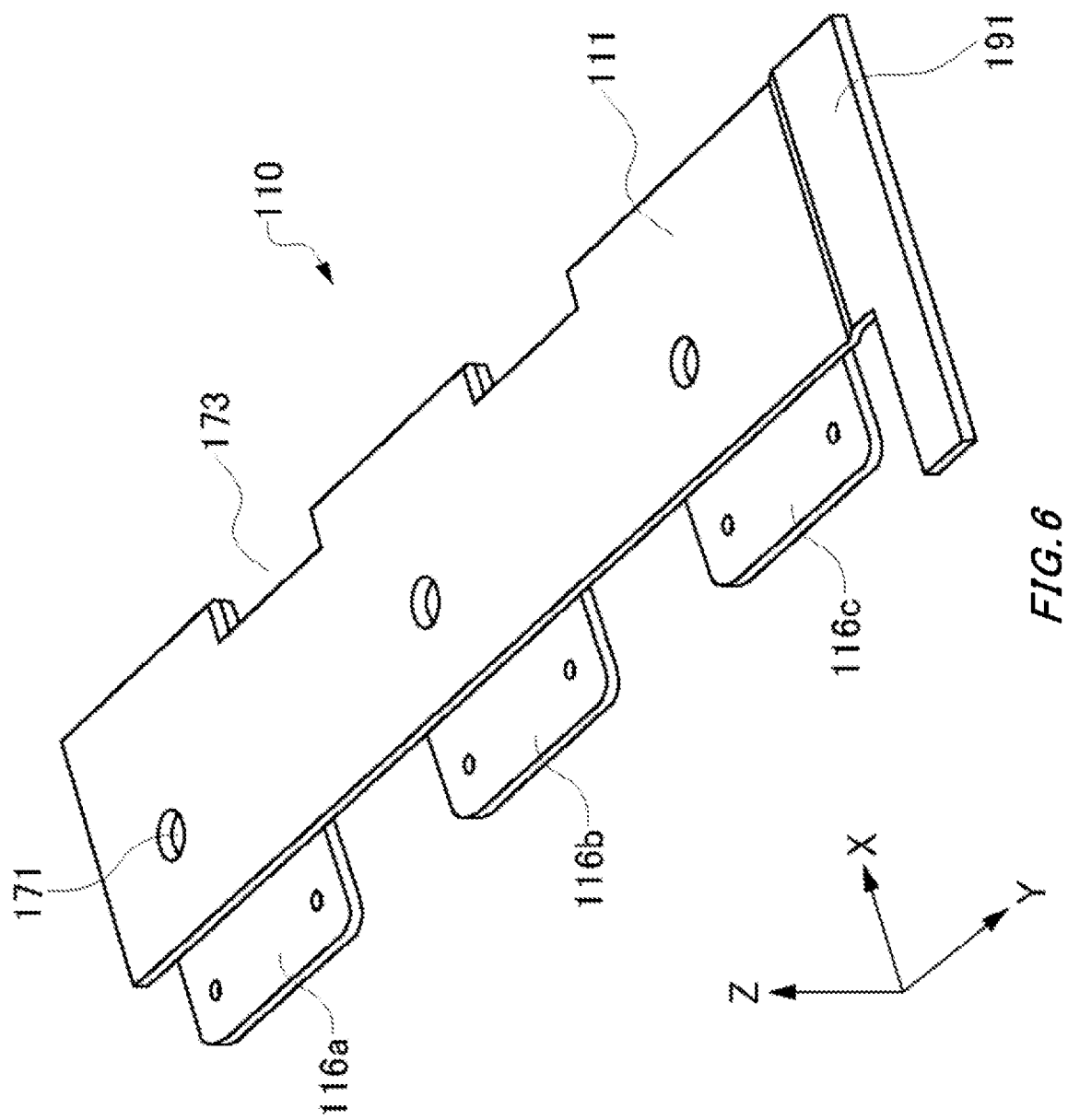
FIG. 6 shows the first lead frame 110.
Figure 7:
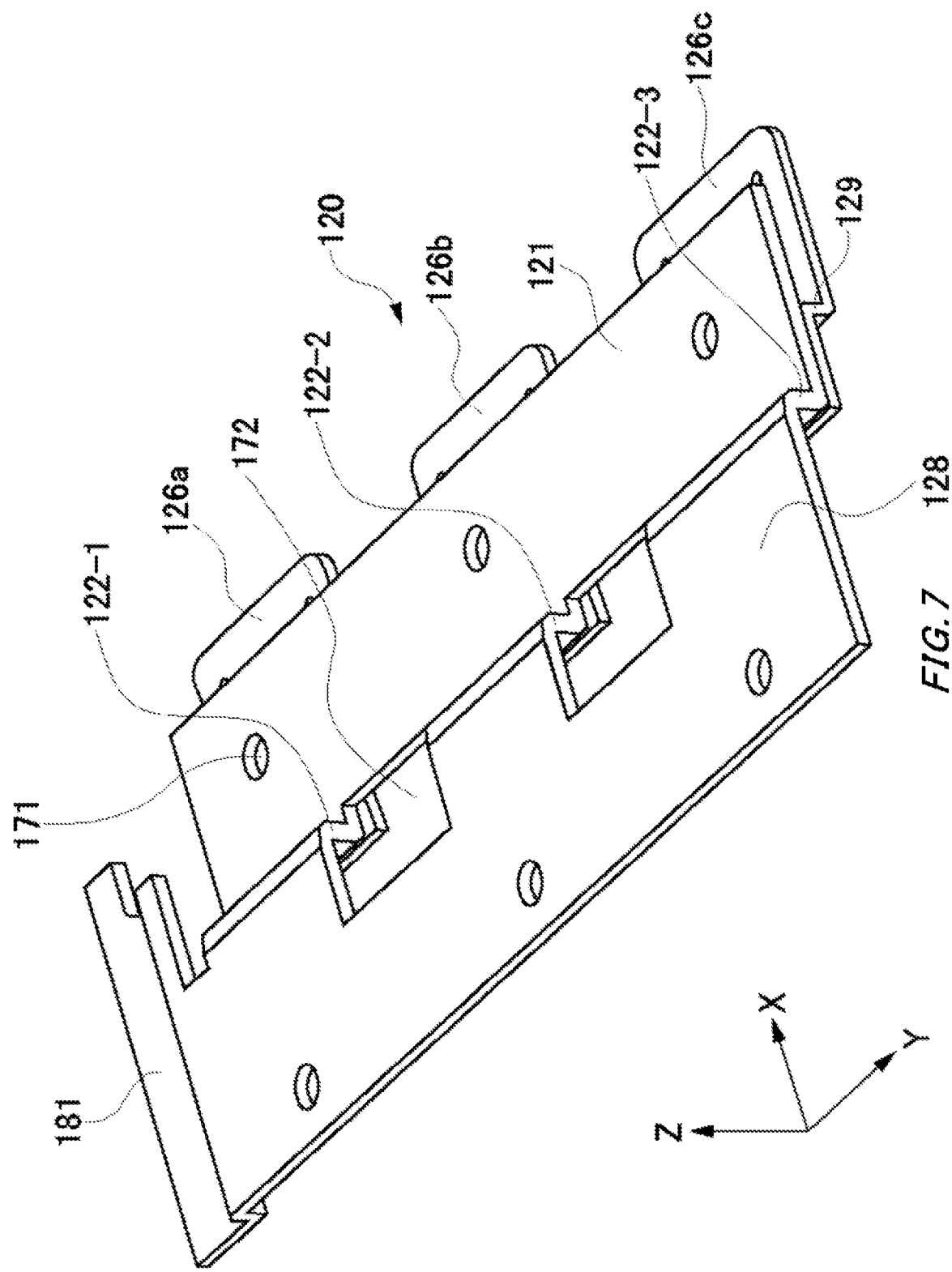
FIG. 7 shows the second lead frame 120.

In particular, a part connected to the plurality of semiconductor chips 144a, 144b and 144c in the first lead frame 110 is arranged in parallel to a part connected to the plurality of semiconductor chips 146a, 146b and 146c in the second lead frame 120 in a top view. According to the semiconductor module 100 of the present embodiment, terminal heat dissipation will be improved as compared to the case based on the wire bonding. FIG. 4 shows an arrangement example of the first lead frame 110 and the second lead frame 120. FIG. 5 shows a cross-section in an arrangement example of the first lead frame 110 and the second lead frame 120. FIG. 6 shows the first lead frame 110. FIG. 7 shows the second lead frame 120.

The first lead frame 110 comprises a first plate-shaped portion 111 as shown in FIG. 4, FIG. 5 and FIG. 6. The plate-shaped portion 111 may have a flat surface (XY plane) that is parallel with a bottom surface of the resin case 160 in the semiconductor module 100. A thickness of the plate-shaped portion 111 in the Z-axis direction is smaller than each width thereof in the X direction and the Y direction. The plate-shaped portion 111 may extend in a direction in which the plurality of semiconductor chips 144a, 144b and 144c are arrayed as a longitudinal direction. In the present example, the plate-shaped portion 111 extends in the Y direction.

The first lead frame 110 comprises the plurality of chip connection portions 116a, 116b and 116c that are connected to the plurality of semiconductor chips 144a, 144b and 144c. The plurality of chip connection portions 116a, 116b and 116c each are connected to the plate-shaped portion 111 through the raised portion 119. The raised portion 119 is a part that is bent toward a plate-shaped portion 111 side with respect to the chip connection portions 116a, 116b and 116c at the end surfaces of the chip connection portions 116a, 116b and 116c. The raised portion 119 is connected to the plate-shaped portion 111. The raised portion 119 does not need to be bent at a right angle with respect to each of the chip connection portions 116a, 116b and 116c, and may be bent at an angle of 30 degrees or larger and 150 degrees or smaller with respect to each of the chip connection portions 116a, 116b and 116c. Also, the raised portion 119 may have a curved surface.

In the first lead frame 110, a terminal connection portion 191 to be electrically connected to the first main terminal is provided at a longitudinal end portion of the plate-shaped portion 111.

Each thickness of the chip connection portions 116a, 116b and 116c is the same as or thinner than the thickness of the plate-shaped portion 111. More preferably, each thickness of chip connection portions 116a, 116b and 116c is thinner than the thickness of the plate-shaped portion 111. Also, a thickness of the terminal connection portion 191 may be the same as or thinner than that of the plate-shaped portion 111. More preferably, the thickness of the terminal connection portion 191 is thinner than that of the plate-shaped portion 111. The thickness of the terminal connection portion 191 is the same as or thicker than each thickness of the chip connection portions 116a, 116b and 116c. With such a configuration, mechanical rigidity of the semiconductor module 100 can be enhanced, and also a stress exerted on the semiconductor chips 144a, 144b and 144c can be relaxed.

The plate-shaped portion 111, the chip connection portions 116a, 116b and 116c, the raised portion 119 and the terminal connection portion 191 may be integrally formed with one conductive material, or may be formed by coupling of the plurality of conductive members.

As shown in FIG. 4, FIG. 5 and FIG. 7, the second lead frame 120 comprises the plate-shaped portion 121 and the overlapping portion 128. The overlapping portion 128 is connected to the plate-shaped portion 121. A principal surface of the overlapping portion 128 in the second lead frame 120 is arranged to overlap a principal surface of the plate-shaped portion 111 in the first lead frame 110 in a top view. An interval between the overlapping portion 128 and the plate-shaped portion 111 so as not to be in contact with each other is provided in the Z-axis direction. The principal surface of the overlapping portion 128 refers to a surface having the largest area and its rear surface in the surfaces of the overlapping portion 128. Similarly, a principal surface of the plate-shaped portion 121 refers to a surface having the largest area and its rear surface in the surface of the plate-shaped portion 121. In the examples of FIG. 4 and FIG. 7, a surface parallel with the XY plane is each principal surface of the overlapping portion 128 and the plate-shaped portion 121.

In the present example, the overlapping portion 128 is connected to the plate-shaped portion 121 through the extension portion 122. The extension portion 122 may be a part that: is formed at an end side in the second lead frame 120 at which the second lead frame 120 faces the first lead frame 110; and extends in the upward direction or downward direction. The extension portion 122 does not need to be bent at a right angle with respect to the plate-shaped portion 121, and may be bent at an angle of 30 degrees or larger and 150 degrees or smaller with respect to the plate-shaped portion 121. Also, the extension portion 122 may have a curved surface. The second lead frame 120 comprises the plurality of chip connection portions 126a, 126b and 126c that connect the plate-shaped portion 121 to the plurality of semiconductor chips 146a, 146b and 146c. The chip connection portions 126a, 126b and 126c are connected to the plate-shaped portion 121 through a raised portion 129. The raised portion 129 is bent toward a plate-shaped portion 121 side with respect to the chip connection portions 126a, 126b and 126c at the end surfaces of the chip connection portions 126a, 126b and 126c. The raised portion 129 may be connected to the plate-shaped portion 121. The raised portion 129 does not need to be bent at a right angle with respect to each of the chip connection portions 126a, 126b and 126c, and may be bent at an angle of 30 degrees or larger and 150 degrees or smaller with respect to each of the chip connection portions 126a, 126b and 126c. Also, the raised portion 129 may also have a curved surface.

In the second lead frame 120, a terminal connection portion 181 to be electrically connected to a second main terminal is provided at a longitudinal end portion of the overlapping portion 128. The longitudinal end portion provided with the terminal connection portion 181 in the overlapping portion 128 is an end portion of the overlapping portion 128 that is located on a longitudinal opposite side from the terminal connection portion 191 of the first lead frame 110.

Each thickness of the chip connection portions 126a, 126b and 126c is the same as or thinner than each of a thickness of the plate-shaped portion 121 and a thickness of the overlapping portion 128. More preferably, each thickness of the chip connection portions 126a, 126b and 126c is thinner than the thickness of the plate-shaped portion 111. Also, a thickness of the terminal connection portion 181 may be the same as or thinner than the thickness of the plate-shaped portion 121 and the thickness of the overlapping portion 128. More preferably, the thickness of the terminal connection portion 181 is thinner than the thickness of the plate-shaped portion 111. The thickness of the terminal connection portion 181 is the same as or thicker than each thickness of the chip connection portions 126a, 126b and 126c. With such a configuration, mechanical rigidity of the semiconductor module 100 can be enhanced, and also a stress exerted on the semiconductor chips 146a, 146b and 146c can be relaxed.

The plate-shaped portion 121, the extension portion 122, the overlapping portion 128, the chip connection portions 126a, 126b and 126c, the raised portion 129 and the terminal connection portion 181 may be integrally formed of one conductive material, or may be formed by coupling of the plurality of conductive members.

When the resin is poured into the resin case 160, an opening 171 may be formed in the plate-shaped portion 111 and the plate-shaped portion 121 such that the resin easily runs around. Also, a cutout 173 may be formed to insert a jig therein in the plate-shaped portion 111. An opening 172 to insert the jig therein may be formed in the extension portion 122. The extension portion 122 is divided into a plurality of extension portions 122a, 122b and 122c by the opening 172.

According to the present example, the overlapping portion 128 of the second lead frame 120 extends to overlap the plate-shaped portion 111 of the first lead frame 110 in a top view. In this way, an area over which the first lead frame 110 and the second lead frame 120 faces each other is enlarged. Accordingly, this can enhance an effect that cancels inductance and induction field to be generated by the first lead frame 110 and the second lead frame 120.

Figure 8:
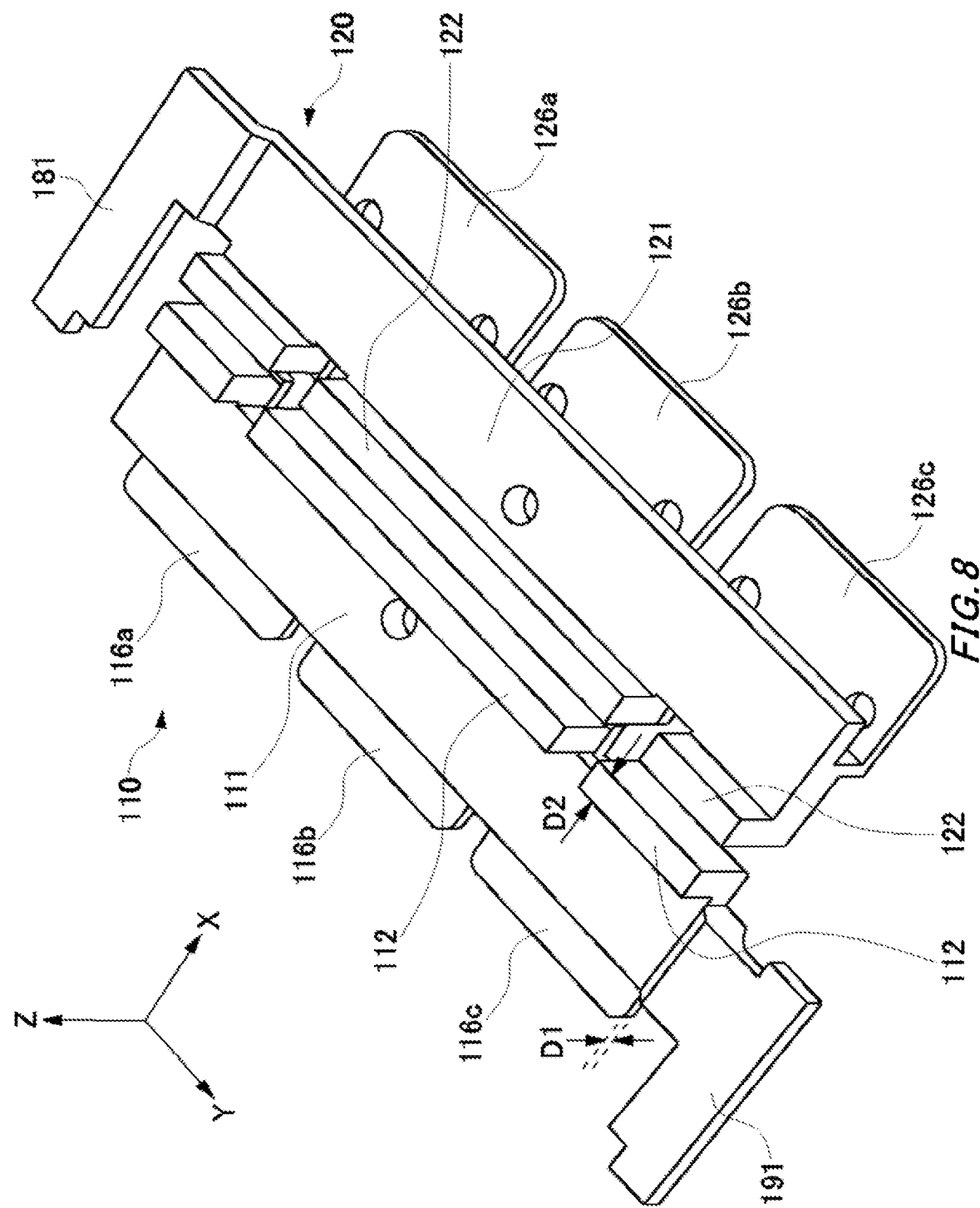
FIG. 8 shows another arrangement example of one pair of lead frames.

FIG. 8 shows another arrangement example of one pair of lead frames. The first lead frame 110 has an extension portion 112. The extension portion 112 is formed at an end side in the first lead frame 110 at which the first lead frame 110 faces the second lead frame 120, and the extension portion 112 extends in the upward direction or the downward direction. In FIG. 8, the second lead frame 120 also comprises the extension portion 122. The extension portion 112 of the first lead frame 110 and the extension portion 122 of the second lead frame 120 may have the same extending direction. In the present example, the extension portion 112 and the extension portion 122 extends in the upward direction. In this way, a facing area is enlarged along end sides at which the first lead frame 110 and the second lead frame 120 face each other. Accordingly, this can enhance an effect that cancels inductance and induction field to be generated by the first lead frame 110 and the second lead frame 120.

In the first lead frame 110, the terminal connection portion 191 to be electrically connected to the first main terminal is provided at the longitudinal end portion of the plate-shaped portion 111. In the second lead frame 120, the terminal connection portion 181 to be electrically connected to the second main terminal is provided at the end portion of the plate-shaped portion 121. The terminal connection portion 181 is provided at the end portion of the plate-shaped portion 121 on the longitudinal opposite side from the terminal connection portion 191 of the first lead frame 110.

Also in the present example, the first lead frame 110 has the chip connection portion 116, and the second lead frame 120 has the chip connection portion 126. The extension portion 112 and the extension portion 122 may have a flat surface portion that extends in parallel to a ZY plane. A thickness D2 of the extension portion 112 and the extension portion 122 in a width direction of the flat surface portion (X direction) is larger than a thickness D1 in a width direction of the chip connection portion (Z direction). In this way, mechanical rigidity of the semiconductor module can be enhanced, and also a stress exerted on the semiconductor chip can be relaxed.

Figure 9:
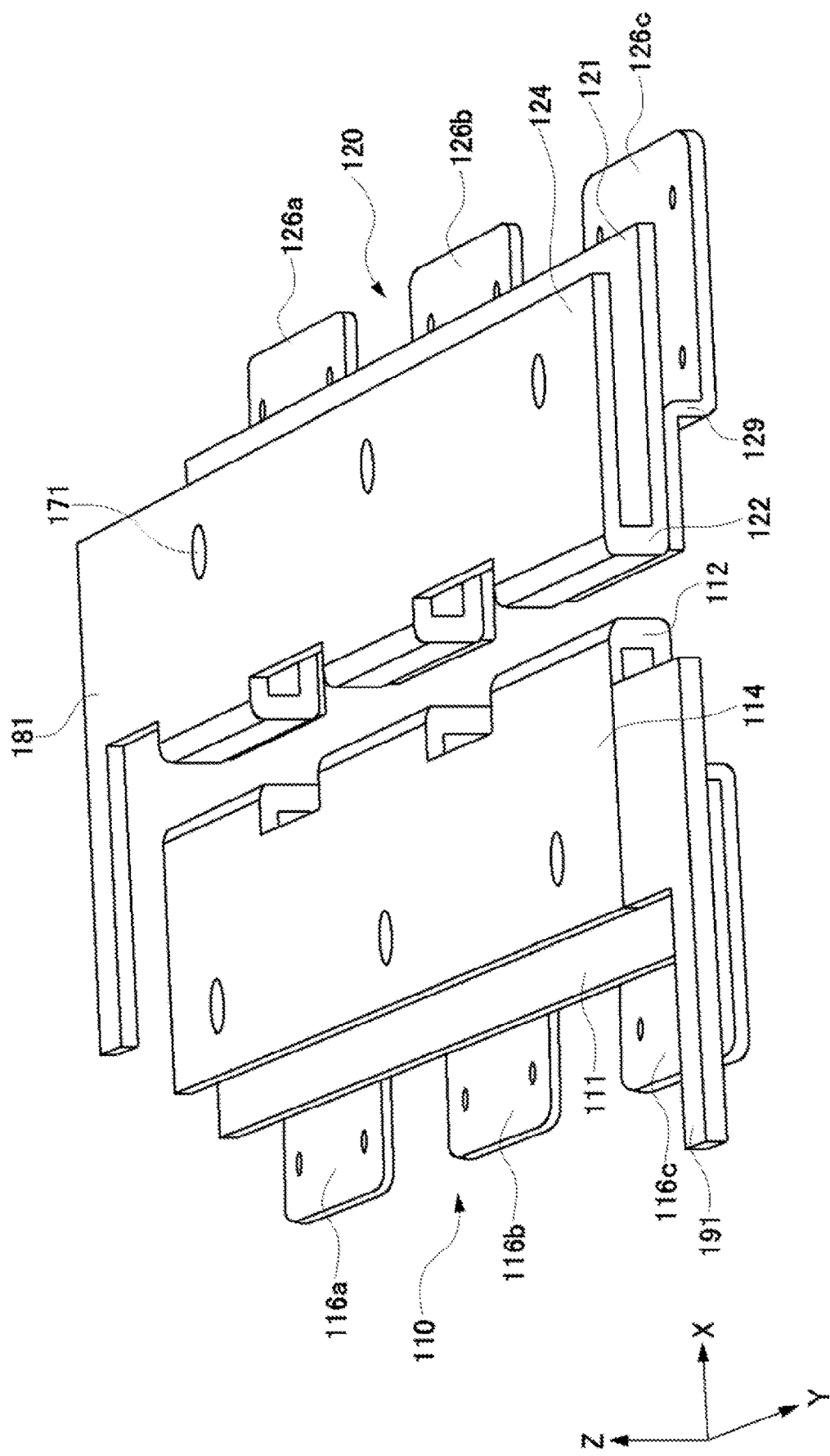
FIG. 9 shows another example of the lead frame.

FIG. 9 shows another example of one pair of lead frames. The first lead frame 110 comprises the plate-shaped portion 111, and a facing portion 114 connected to the extension portion 112. The extension portion 112 is formed at the end side in the first lead frame 110 at which the first lead frame faces the second lead frame 120, and the extension portion 112 extends in the upward direction or the downward direction. The facing portion 114 is a plate-shaped part connected to the extension portion 112 and arranged to face the plate-shaped portion 111. In the present example, the plate-shaped portion 111 extends in the +X-axis direction, and is folded in the −X-axis direction at the extension portion 112.

The second lead frame 120 comprises the plate-shaped portion 121 and a facing portion 124 connected to the extension portion 122. The extension portion 122 is formed at the end side in the second lead frame 120 at which the second lead frame 120 faces the first lead frame 110, and the extension portion 122 extends in the upward direction or the downward direction. The facing portion 124 is a plate-shaped part connected to the extension portion 122 and arranged to face the plate-shaped portion 121. In the present example, the plate-shaped portion 121 extends in the −X direction, and is folded back at the extension portion 122 in the −X direction. The lengths of the first extension portion 112 and the second extension portion 122 in the Z direction may be different.

In the first lead frame 110, the terminal connection portion 191 is provided at the end portion of the facing portion 114 or the end portion of the plate-shaped portion 111. Also, in the second lead frame 120, the terminal connection portion 181 is provided at the end portion of the facing portion 124 or the end portion of the plate-shaped portion 121. The terminal connection portion 191 and the terminal connection portion 181 are provided at end portions on opposite sides in a longitudinal direction of the lead frame (Y direction). Also, even in the present example, the chip connection portion 116 and the chip connection portion 126 may be provided.

According to the semiconductor module 100 of the present example, the facing area is enlarged in end sides at which the first lead frame 110 and the second lead frame 120 face each other. This can enhance an effect that cancels inductance and induction field to be generated by the first lead frame 110 and the second lead frame 120. Also, since a surface area of the first lead frame 110 and the second lead frame 120 can be enlarged, heat dissipation can be enhanced. Also, a cross-sectional area of the lead frame can be increased by the folding while an area in which the first lead frame 110 and the second lead frame 120 occupy in the XY plane is maintained. This makes it easy to flow therein a large current.

Figure 10:
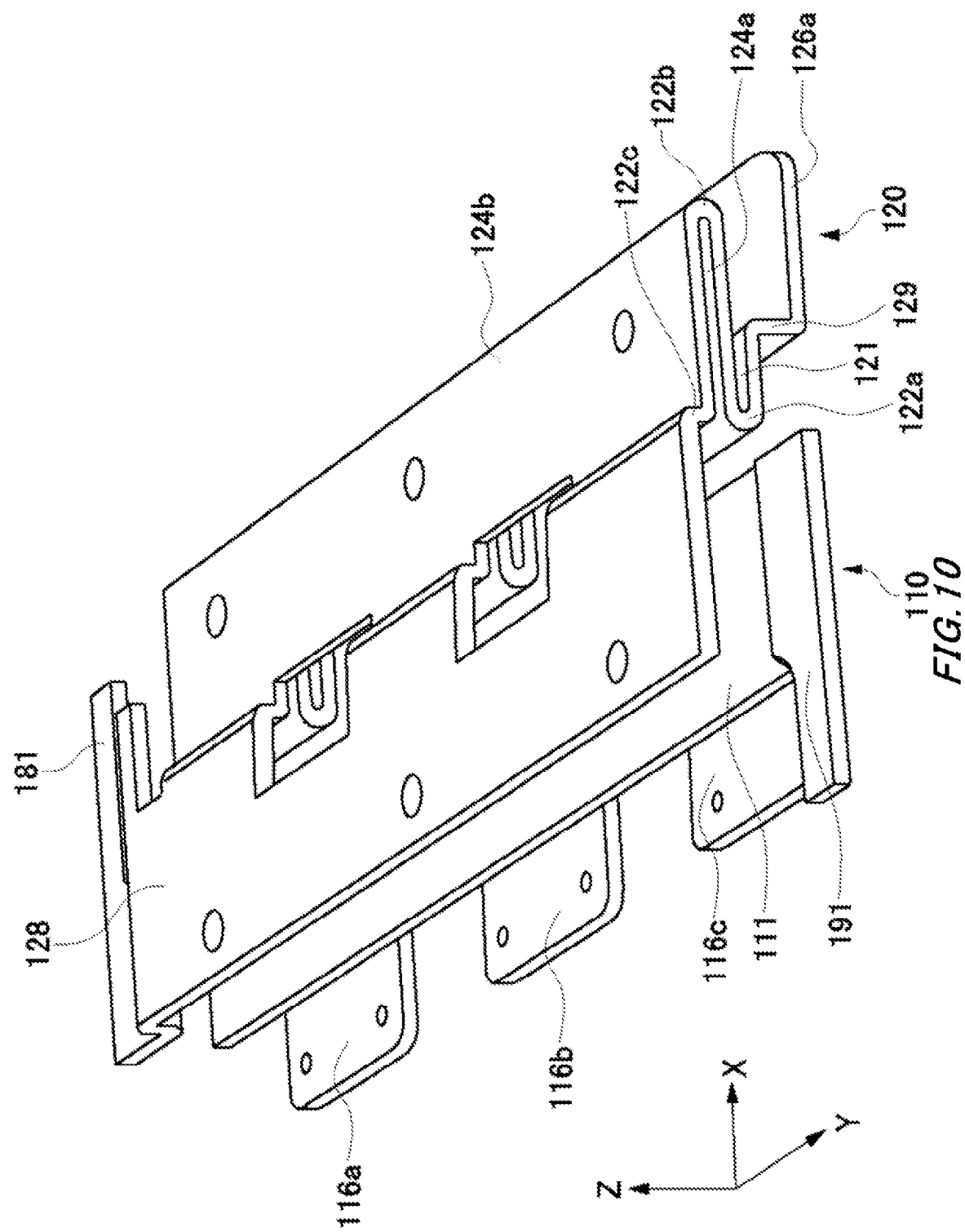
FIG. 10 shows another example of the lead frame.

FIG. 10 shows another example of the lead frame. The second lead frame 120 of the present example is a modification of the second lead frame 120 shown in FIG. 4. Accordingly, a detailed explanation will be omitted with respect to a structure similar to a configuration shown in FIG. 4. The second lead frame 120 comprises the chip connection portion 126, the raised portion 129, the plate-shaped portion 121, the extension portion 122a, a facing portion 124a, an extension portion 122b, a facing portion 124b, an extension portion 122c, the overlapping portion 128 and the terminal connection portion 181. The overlapping portion 128 of the second lead frame 120 is arranged to overlap the plate-shaped portion 111 of the first lead frame 110 in a top view. An interval between the overlapping portion 128 and the plate-shaped portion 111 so as not to be in contact with each other is provided in the Z-axis direction. Also, the extension portion 122a of the second lead frame 120 is arranged at a height position (same position in the Z-axis direction) at which the first lead frame 110 faces an end side on a second lead frame 120 side (end side in the +X-axis direction) in the plate-shaped portion 111 of the first lead frame 110.

The terminal connection portion 181 is provided at the end portion of the overlapping portion 128. The terminal connection portion 191 of the first lead frame 110 and the terminal connection portion 181 of the second lead frame 120 are provided on opposite sides in the longitudinal direction of the lead frame (Y direction).

The second lead frame 120 of the present example comprises the chip connection portion 126. The chip connection portion 126 is connected to the plate-shaped portion 121 through the raised portion 129 that is bent from the end side of the chip connection portion 126 in the −X-axis direction (end side facing the first lead frame 110).

According to the present example, the extension portion 122a and the overlapping portion 128 of the second lead frame 120 are formed. For that reason, the facing area over which the first lead frame 110 faces the second lead frame 120 is enlarged. This can enhance an effect that cancels inductance and induction field to be generated by the first lead frame 110 and the second lead frame 120. Further, by the folding effect, the surface area of the second lead frame 120 can be enlarged to enhance heat dissipation, and also the cross-sectional area thereof can be enlarged to handle a larger current.

Figure 11:
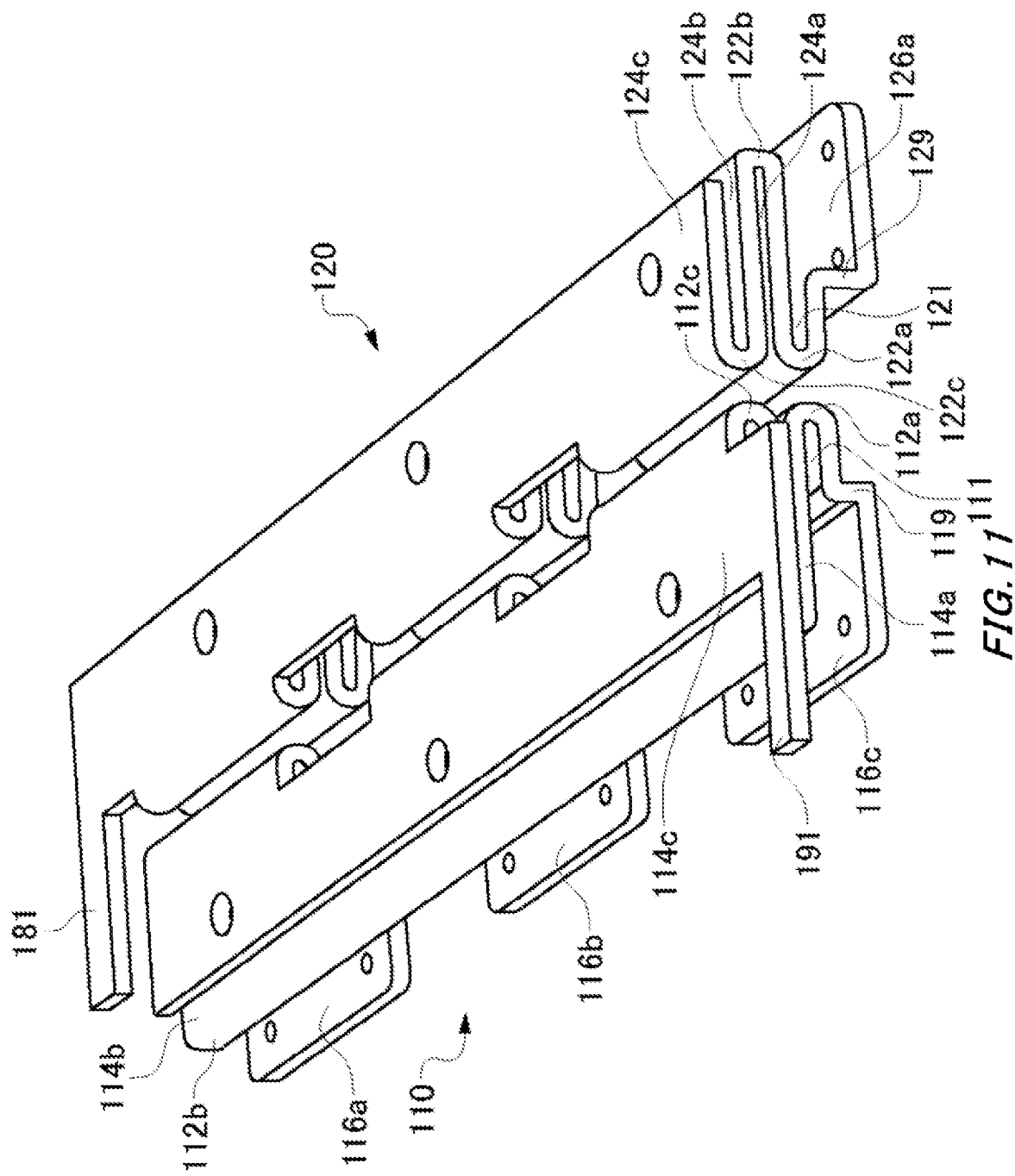
FIG. 11 shows another example of the lead frame.

FIG. 11 shows another example of the lead frame. In the first lead frame 110 of the present example, a metal plate or the like is folded over a plurality of times to enlarge the cross-sectional area. The first lead frame 110 comprises the chip connection portion 116, the raised portion 119, the plate-shaped portion 111, an extension portion 112a, a facing portion 114a, an extension portion 112b, a facing portion 114b, an extension portion 112c, a facing portion 114c and the terminal connection portion 191. The second lead frame 120 has a similar configuration. Then, the terminal connection portion 191 of the first lead frame 110 and the terminal connection portion 181 of the second lead frame 120 are provided on opposite sides in the longitudinal direction of the lead frame (Y direction). In the present example, since the extension portion 112a faces the extension portion 122a, and the extension portion 112c faces the extension portion 122c, a facing area between the first lead frame 110 and the second lead frame 120 is enlarged. This can enhance an effect that cancels inductance and induction field to be generated by the first lead frame 110 and the second lead frame 120.

Figure 12:
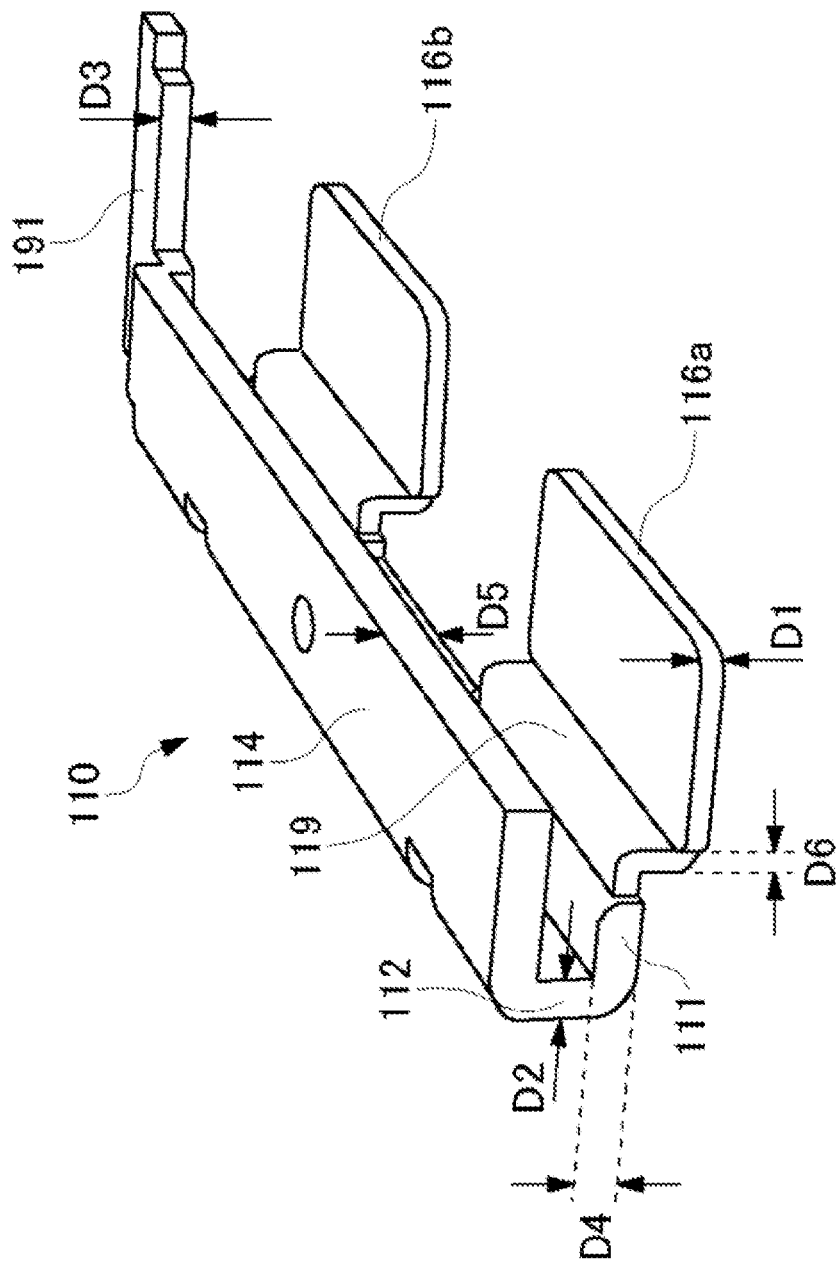
FIG. 12 shows an example of a chip connection portion.

FIG. 12 shows an example of the chip connection portion 116. The stacked substrate is provided in the housing part of the semiconductor module 100. The chip connection portion 116 of the first lead frame 110 may be soldered to the semiconductor chip 144 arranged on the stacked substrate. In this case, a thickness D1 of the chip connection portion 116 may be set to 0.6 mm or smaller. When the semiconductor chip 144 and the chip connection portion 116 having a different thermal expansion coefficient are soldered, a stress occurs. However, according to the semiconductor module 100 of the present example, when the thickness D1 of the chip connection portion 116 is set to 0.6 mm or smaller, the stress can be relaxed. A thickness D4 of the plate-shaped portion 111 may be thicker than the thickness D1 of the chip connection portion 116. A thickness D2 of the extension portion 112 may be thicker than the thickness D1 of the chip connection portion 116. A thickness D5 of the facing portion 114 may be thicker than the thickness D1 of the chip connection portion 116. A thickness D3 of the terminal connection portion 191 may be thicker than the thickness D1 of the chip connection portion 116, and may be the same as or thinner than the thickness D4 of the plate-shaped portion 111. A thickness D6 of the raised portion 119 may be set to the thickness D1 or more of the chip connection portion 116, and to the thickness D4 or less of the plate-shaped portion 111. When rigidity of the plate-shaped portion 111, the extension portion 112 and the facing portion 114 is enhanced, mechanical rigidity of the semiconductor module 100 can be enhanced. Also, an increase in cross-sectional area of the plate-shaped portion 111, the extension portion 112 and the facing portion 114 can reduce an electrical resistance thereof. A decrease in rigidity of the chip connection portion 116, the raised portion 119 and the terminal connection portion 191 can relax a stress exerted on the semiconductor chip 144.

Figure 13:
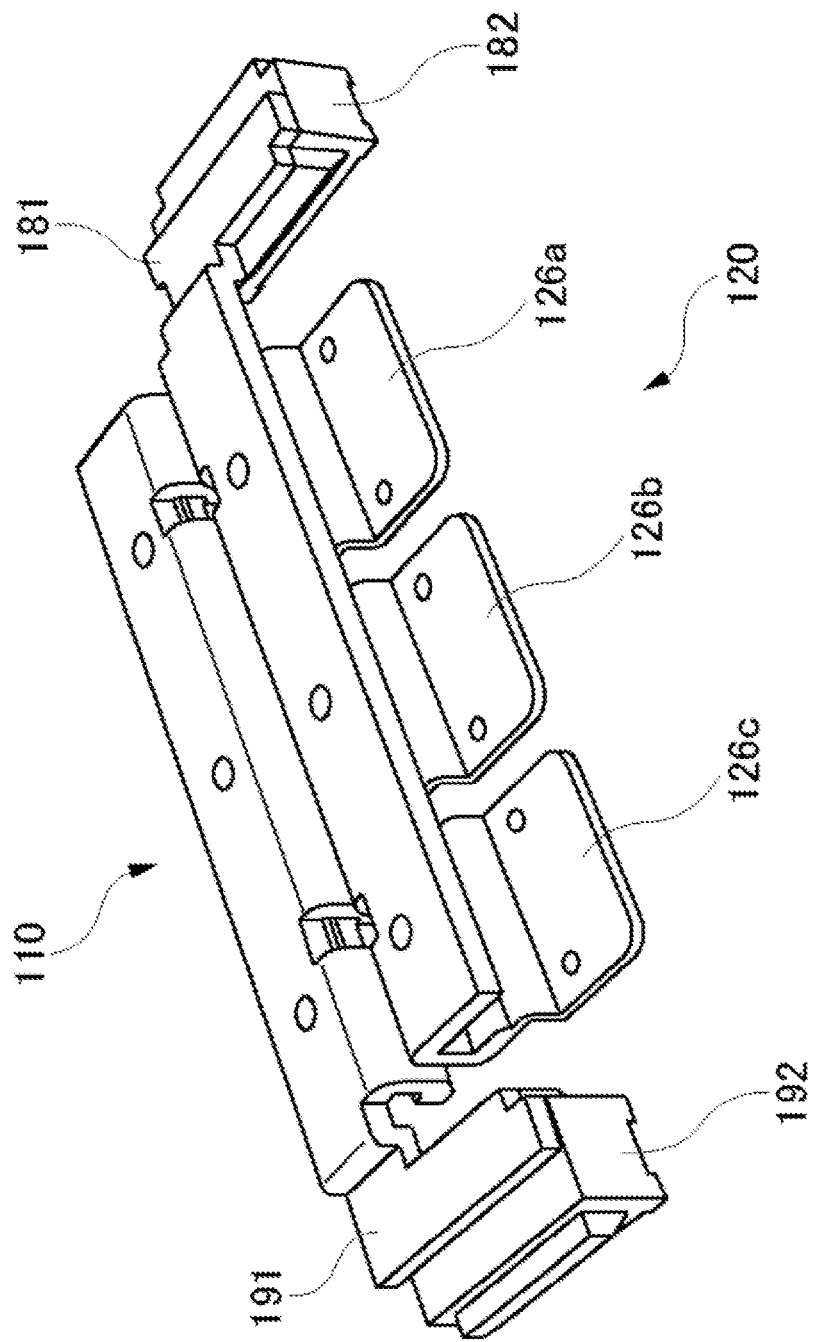
FIG. 13 shows a connection example of the lead frame.

FIG. 13 shows a connection example of the lead frame. One end side of the first lead frame 110 may be is located on the semiconductor chip 144 through the chip connection portion 116, and the terminal connection portion 191 on the other end side may be electrically connected to the first main terminal through an conductive block 192. One end side of the second lead frame 120 may be is located on the semiconductor chip 146 through the chip connection portion 126, and the terminal connection portion 181 on the other end side may be electrically connected to the second main terminal through an conductive block 182. The conductive blocks 182, 192 are, for example, cupper blocks.

Figure 14:
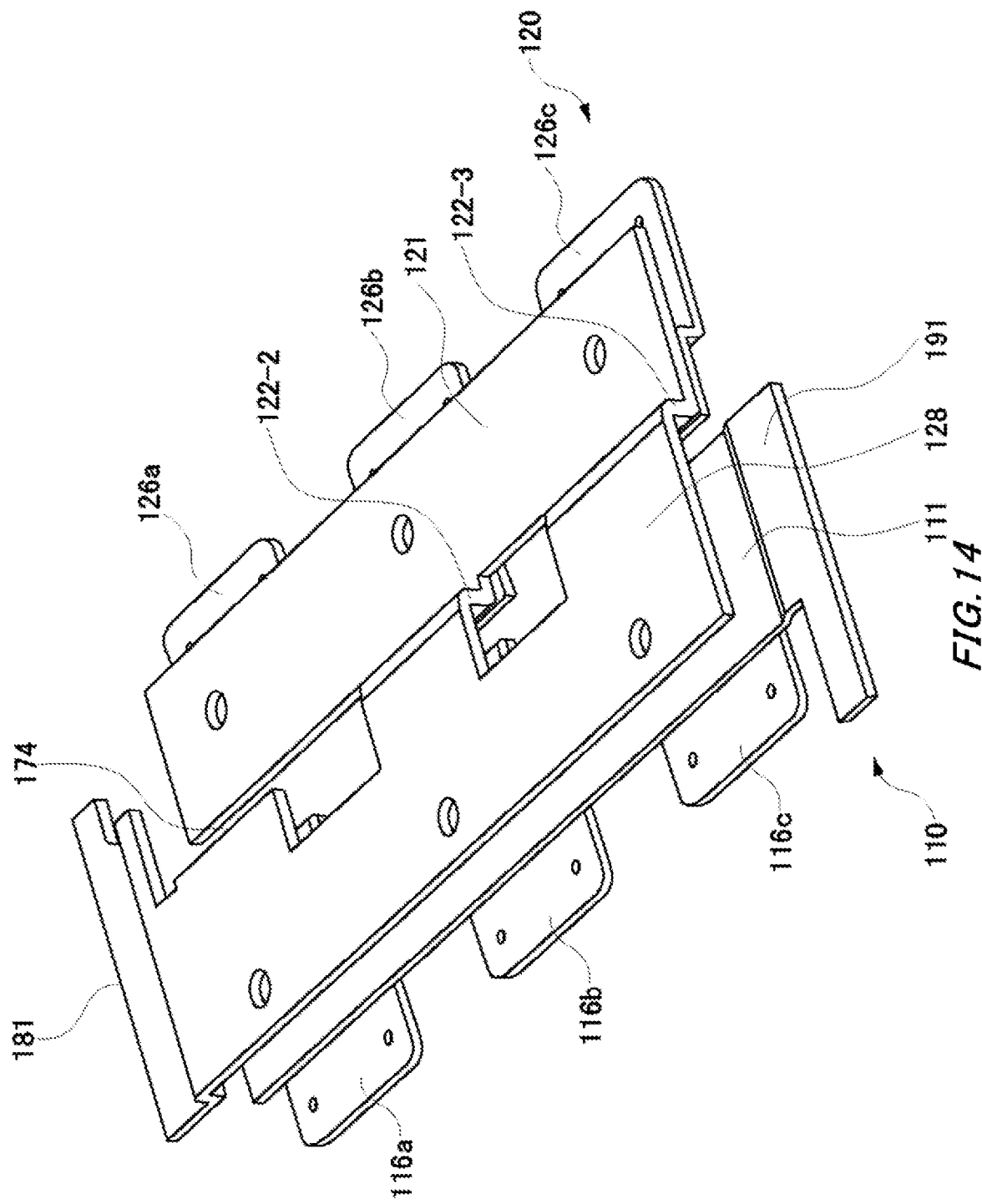
FIG. 14 shows one example of the lead frame in which a cutout is formed.

FIG. 14 shows one example of the second lead frame 120 in which a cutout 174 is formed. In a case where one end of the second lead frame 120 is connected to the plurality of semiconductor chips 146a, 146b and 146c, and the terminal connection portion 181 on the other end side is connected to the second main terminal, there occurs a difference between lengths in current path between the respective plurality of semiconductor chips 146a, 146b and 146c and the second main terminal. The present example corrects the length in current path.

According to the semiconductor module 100 of the present example, the second lead frame 120 comprises the extension portion 122. The extension portion 122 may couple the plate-shaped portion 121 to the overlapping portion 128. The cutout 174 may be formed in the extension portion 122. In the present example, the cutout 174 is formed to span from the terminal connection portion 181 closer to the second main terminal to a position at which the cutout 174 faces the semiconductor chip 146a closest to the second main terminal in the plurality of semiconductor chips 146a, 146b and 146c. As a result, the current path between the semiconductor chip 146a and the second main terminal is lengthened, which suppress a difference in length of current path between the plurality of semiconductor chips 146a, 146b and 146c.

In the present example, the N terminal 152 and the U terminal 155a (or the V terminal 155b or the W terminal 155c) that form the arm circuit are arranged on the side surface of the resin case 160. In the present example, the N terminal 152 may be arranged along one side surface of the resin case 160 (side surface on the +Y-axis direction side), and the U terminal 155a (the V terminal 155b and the W terminal 155c) may be arranged along the other side surface that faces the one side surface described above (side surface on the −Y-axis direction side). Also, the terminal connection portion 191 formed at the end portion of the first lead frame 110 is connected to the N terminal 152. The terminal connection portion 181 formed at the end portion of the second lead frame 120 is connected to the U terminal 155a (or the V terminal 155b or the W terminal 155c). For that reason, the terminal connection portion 191 and the terminal connection portion 181 are formed on opposite sides when viewed from the center of the lead frame in a top view.

In a first aspect of the present invention, the first lead frame 110 has the plate-shaped portion 111, the terminal connection portion 191 and the chip connection portion 116. The plate-shaped portion 111 has a flat plate-shaped principal surface in a substantially rectangular shape. The terminal connection portion 191 is provided on a shorter side of the principal surface of the plate-shaped portion 111, and electrically connected to the N terminal 152. Further, the chip connection portion 116 is formed on a principal surface side with the plurality of semiconductor chips, in the principal surfaces of the plate-shaped portion 111 in a substantially rectangular shape. The second lead frame 120 has the plate-shaped portion 121, the terminal connection portion 181, the chip connection portion 126 and the overlapping portion 128. The overlapping portion 128 is provided to extend from a principal surface end portion of the plate-shaped portion 121. The terminal connection portion 181 is provided on the shorter side of the principal surface in a substantially rectangular shape of the overlapping portion 128, and is electrically connected to the U terminal 155a (or the V terminal 155b or the W terminal 155c). Further, the principal surface of the plate-shaped portion 111 of the first lead frame 110 faces the overlapping portion 128 of the second lead frame 120 on the XY plane. The terminal connection portion 191 and the terminal connection portion 181 are formed on opposite sides when viewed from the facing part of the lead frame in the Y-axis direction.

In a second aspect of the present invention, the first lead frame 110 has the plate-shaped portion 111, the terminal connection portion 191, the chip connection portion 116 and the extension portion 112. The plate-shaped portion 111 has the flat plate-shaped principal surface in a substantially rectangular shape. The terminal connection portion 191 is provided on the shorter side of the principal surface of the plate-shaped portion 111, and electrically connected to the N terminal 152. Further, the chip connection portion 116 is formed on the principal surface side with the plurality of semiconductor chips, in the principal surfaces of the plate-shaped portion 111 in a substantially rectangular shape. The extension portion 112 is provided to extend in the Z-axis direction from a longer side on the principal surface of the plate-shaped portion 111. Further, the chip connection portion 116 is formed on one side in the longer sides of the plate-shaped portion 111 in a substantially rectangular shape, and the extension portion 112 is formed on the other side. The second lead frame 120 has the plate-shaped portion 121, the terminal connection portion 181, the chip connection portion 126 and the extension portion 122. The plate-shaped portion 121 has the flat plate-shaped principal surface in a substantially rectangular shape. The terminal connection portion 181 is provided at the shorter side on the principal surface of the plate-shaped portion 121, and is electrically connected to the U terminal 155a (or the V terminal 155b or the W terminal 155c). Further, the chip connection portion 126 is formed on a principal surface side with the plurality of semiconductor chips, in the principal surfaces of the plate-shaped portion 121 in a substantially rectangular shape. The extension portion 122 is provided to extend in the Z-axis direction from a longer side on the principal surface of the plate-shaped portion 121. Further, the chip connection portion 126 is formed on one side in the longer sides of the plate-shaped portion 121 in a substantially rectangular shape, and the extension portion 122 is formed on the other side. Further, the principal surface of the extension portion 112 of the first lead frame 110 faces the principal surface of the extension portion 122 of the second lead frame 120 on the YZ plane. The terminal connection portion 191 and the terminal connection portion 181 are formed on opposite sides when viewed from the facing part of the lead frame in the Y-axis direction.

In a third aspect of the present invention, the first lead frame 110 has the plate-shaped portion 111, the terminal connection portion 191, the chip connection portion 116, the extension portion 112 and the facing portion 114. The plate-shaped portion 111 has the flat plate-shaped principal surface in a substantially rectangular shape. The chip connection portion 116 is formed on the principal surface side with the plurality of semiconductor chips, in the principal surfaces of the plate-shaped portion 111 in a substantially rectangular shape, and the extension portion 112 is provided on the other principal surface side of the plate-shaped portion 111. The extension portion 112 is provided to extend in the +Z-axis direction from the longer side on the principal surface of the plate-shaped portion 111. Further, the facing portion 114 is provided in a direction to face the plate-shaped portion 111 from the end side of the extension portion 112. The terminal connection portion 191 is provided on the shorter side of the principal surface of the facing portion 114, and electrically connected to the N terminal 152. Further, the second lead frame 120 has the plate-shaped portion 121, the terminal connection portion 181, the chip connection portion 126, the extension portion 122 and the facing portion 124. The plate-shaped portion 121 has the flat plate-shaped principal surface in a substantially rectangular shape. The chip connection portion 126 is formed on the principal surface side with the plurality of semiconductor chips, in the principal surfaces of the plate-shaped portion 121 in a substantially rectangular shape, and the extension portion 122 is provided on the other principal surface side of the plate-shaped portion 121. The extension portion 122 is provided to extend in the +Z-axis direction from the longer side on the principal surface of the plate-shaped portion 121. Further, the facing portion 124 is provided in a direction to face the plate-shaped portion 121 from the end side of the extension portion 122. The terminal connection portion 181 is provided on the shorter side of the principal surface of the facing portion 124, and is electrically connected to the U terminal 155a (or the V terminal 155b or the W terminal 155c). Further, the principal surface of the extension portion 112 of the first lead frame 110 faces the principal surface of the extension portion 122 of the second lead frame 120 on the YZ plane. The terminal connection portion 191 and the terminal connection portion 181 are formed on opposite sides when viewed from the facing part of the lead frame in the Y-axis direction.

As described above, according to the semiconductor modules in the aforementioned various embodiments, a wiring structure that handles a large current can be achieved. Moreover, the semiconductor modules contribute to reduction of internal inductance. In particular, the semiconductor module 100 has the upper arm circuit 146 and the lower arm circuit 144, and is suitably used as an electric automobile (electric drive vehicle) and a power conversion unit in the power control unit.

Figure 15:
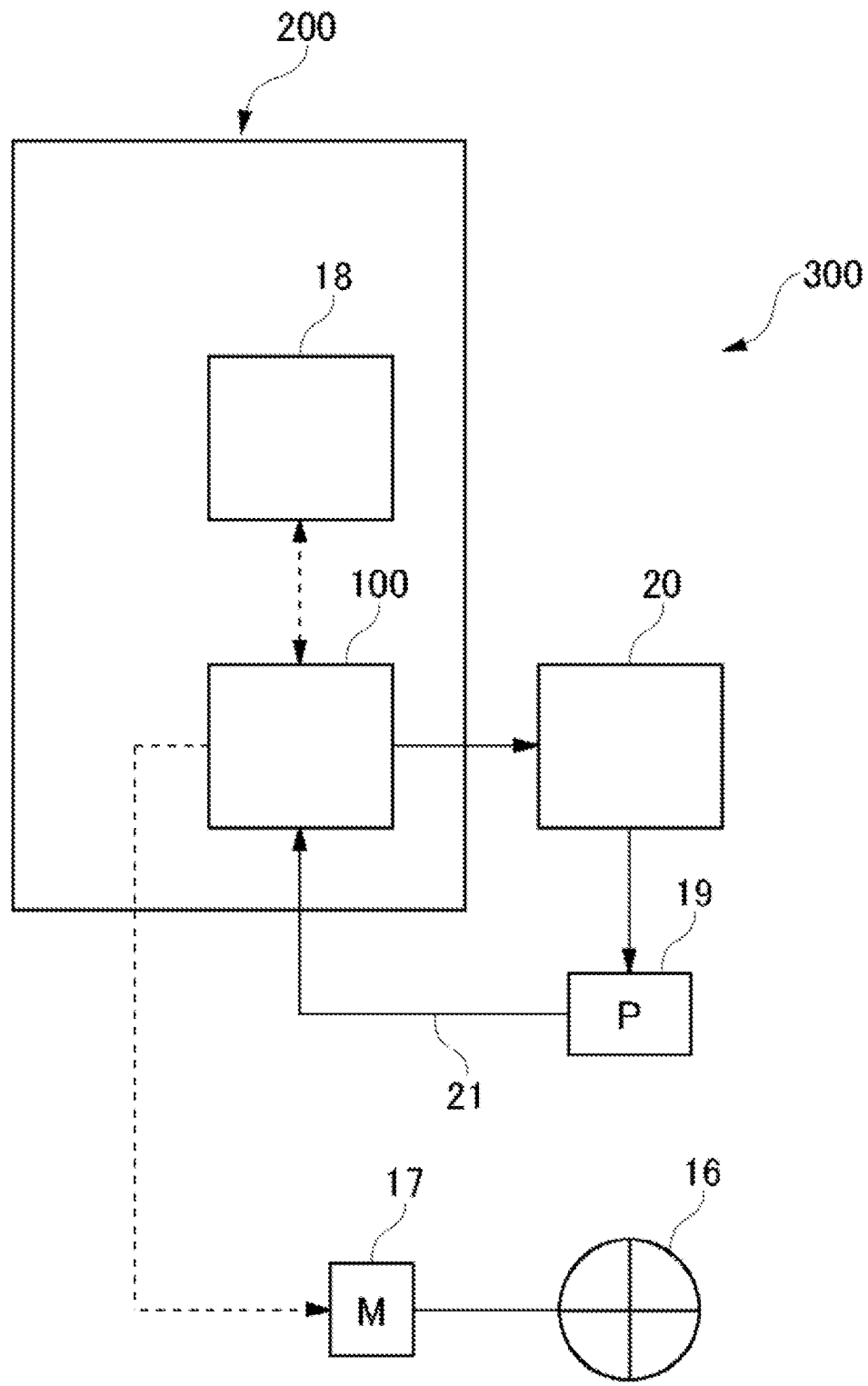
FIG. 15 shows an electric automobile and a power control unit of one embodiment in the present invention.

FIG. 15 is a schematic configuration diagram in a drive system of an electric automobile 300. The electric automobile 300 comprises at least any one of the semiconductor modules 100 mentioned above, a motor 17, a central processing unit 18, a pump 19, a heat exchanger 20 and piping 21. The motor 17 rotates a wheel 16 using a mechanism that mechanically transmits a driving force to the wheel 16.

The motor 17 is driven by the electric power output from the semiconductor module 100. The central processing unit 18 controls the semiconductor module 100. The pump 19 transports a refrigerant that cools the semiconductor module 100. The heat exchanger 20 cools the refrigerant. The piping 21 connects the pump 19 to the heat exchanger 20 in a closed circuit condition to form a refrigerant flow passage.

In particular, a power control unit 200 power that at least has the semiconductor module 100 and the central processing unit 18 is a power conversion apparatus that performs power conversion in the electric automobile 300. Specifically, a battery of the electric automobile 300 is used as a main power supply. The positive electrode of the battery is connected to the P terminal 151 of the semiconductor module 100, and the negative electrode of the battery is connected to the N terminal 152 of the semiconductor module 100. Then, the U terminal 155a, the V terminal 155b and the W terminal 155c that are AC output terminals are connected to the motor 17. The electric power to be supplied to the motor 17 may be controlled such that the central processing unit 18 gives control signals to the control terminals of the semiconductor chip 144 and the semiconductor chip 146.

Figure 16:
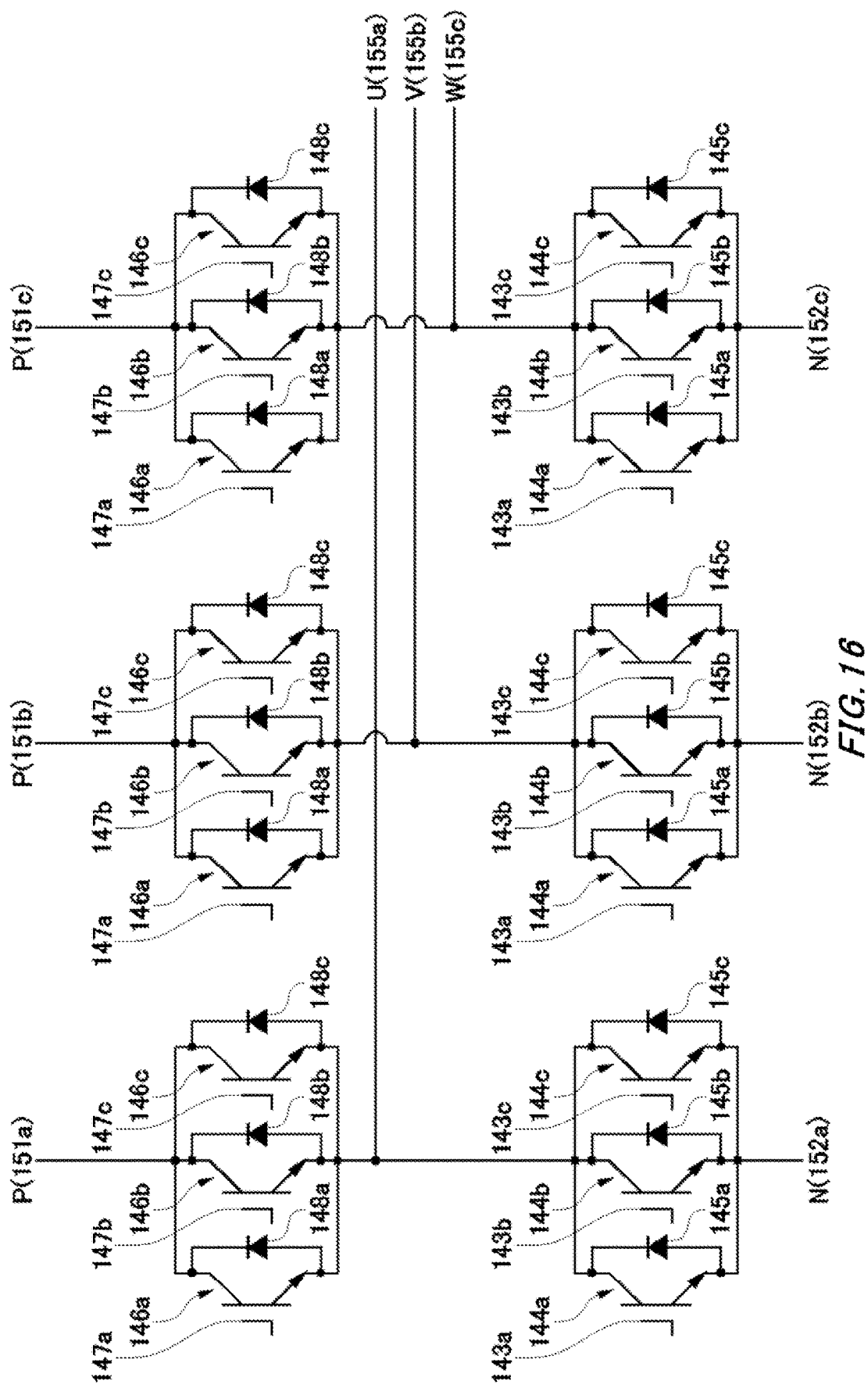
FIG. 16 is a circuit diagram showing one example of a main circuit of the semiconductor module 100 that includes a reverse-conducting insulated gate bipolar transistor.

As mentioned above, the plurality of semiconductor chips 144a, 144b, 144c, 146a, 146b and 146c each may be a reverse-conducting insulated gate bipolar transistor (RC-IGBT). FIG. 16 is a circuit diagram showing one example of a main circuit in the semiconductor module 100 that includes the reverse-conducting insulated gate bipolar transistor. The circuit shown in FIG. 16 is similar to the circuit shown in FIG. 2 except for a configuration of a semiconductor chip.

FIG. 16 shows a three-phase inverter. The three-phase inverter has three sets of the lower arm circuits 144 and three sets of the upper arm circuits 146. Each lower arm circuit 144 has a set of three semiconductor chips, the semiconductor chips 144a, 144b and 144c. The three semiconductor chips 144a, 144b and 144c in each lower arm circuit 144 are electrically connected in parallel. Similarly, each upper arm circuit 146 has a set of three semiconductor chips, the semiconductor chips 146a, 146b and 146c. The three semiconductor chips 146a, 146b and 146c in each upper arm circuit 146 are electrically connected in parallel.

In the present example, respective semiconductor chips 144a to 144c include IGBTs 143a to 143c and freewheeling diodes 145a to 145c. The freewheeling diodes 145a to 145c are connected in anti-parallel to the IGBTs 143a to 143c, respectively. Specifically, cathodes of the freewheeling diodes 145a to 145c are connected to collectors that serve as high potential side electrodes of the IGBTs 143a to 143c, respectively. Anodes of the freewheeling diodes 145a to 145c are connected to emitters that serve as low potential side electrodes of the IGBTs 143a to 143c, respectively.

Respective semiconductor chips 146a to 146c include IGBTs 147a to 147c and freewheeling diodes 148a to 148c. The freewheeling diodes 148a to 148c are connected in anti-parallel to the IGBTs 147a to 147c, respectively. Note that in the main circuit shown in FIG. 16, similarly to the case shown in FIG. 2, the first lead frame 110 has a part connected to emitter terminals of the plurality of semiconductor chips 144a, 144b and 144c included in the lower arm circuit 144. The second lead frame 120 has a part connected to emitter terminals of the plurality of semiconductor chips 146a, 146b and 146c included in the upper arm circuit 146.

According to the semiconductor module 100 using the RC-IGBT as shown in FIG. 16, miniaturization and lower thermal resistance of the semiconductor module 100 can be attained. Further, in order to achieve higher output and higher voltage of the semiconductor module 100, enlargement in chip area and high breakdown voltage for each of the semiconductor chips 144a, 144b, 144c, 146a, 146b and 146c are attained. As a member for connection of the emitter terminals of the semiconductor chips 144a, 144b and 144c, the aforementioned first lead frame 110 may be used in place of a bonding wire. As a member for connecting the emitter terminal of each of the semiconductor chips 146a, 146b and 146c, the second lead frame 120 may be used.

In a case where a large capacity chip in which a large current flows is arranged as each semiconductor chip in a narrow space, an effect of mutual inductance is increased. Therefore, there are some cases where makes it difficult to achieve low inductance, and suppression of variations between the inductances in the semiconductor chips 144a, 144b and 144c.

Similarly, it also becomes difficult to suppress variations between the inductances in the semiconductor chips 146a, 146b and 146c.

With a larger capacity of each of the semiconductor chips 144a, 144b, 144c, 146a, 146b and 146c that are the RC-IGBTs, time change of current per chip (di/dt) is increased. Also, when the first lead frame 110 and the second lead frame 120 are used in place of the bonding wires, the inductance is reduced. Due to the fact that the time change of current per chip (di/dt) is increased, imbalance in inductance from each emitter in the semiconductor chips 146a, 146b and 146c to the first main terminal occurs. Similarly, imbalance in inductance from each emitter in the semiconductor chips 144a, 144b and 144c to the second main terminal occurs. The imbalance in inductance causes imbalance in current between the semiconductor chips 144a, 144b and 144c. The current concentrates on a specific semiconductor chip because of the imbalance in current.

Specifically, in FIG. 16, the IGBTs 147a, 147b and 147c are turned from an OFF state to an ON state, a collector current Ic flows through the IGBTs 147a, 147b and 147c at the time when a gate voltage Vge is beyond threshold voltages Vth of the IGBTs 147a, 147b and 147c, respectively. Then, the freewheeling diodes 145a, 145b and 145c of the facing arm (lower arm circuit 144) are reversely recovered. Then, with the reverse recovery, the gate voltages of the IGBTs 143a, 143b and 143c of the facing arm are increased.

In the present example, the current concentrates on the IGBT 147a because of the occurrence of the imbalance in current between the IGBTs 147a, 147b and 147c. In this way, the increase of the gate voltage in any IGBT of the IGBTs 143a, 143b and 143c of the facing arm, for example, in the IGBT 143c is remarkably exhibited. As a result, in a case where the gate voltage is beyond a predetermined threshold voltage, for example, erroneous turning-on of the IGBT 143c occurs.

Accordingly, it is desirable that with low inductance, the first lead frame 110 and the second lead frame 120 capable of suppressing a difference in inductance between the semiconductor chips are provided. In this way, the imbalance in current of the semiconductor chips 146a to 146c constituting the upper arm circuit 146, and the imbalance in current of the semiconductor chips 144a to 144c constituting the lower arm circuit 144 can be overcome, and also erroneous turning-on can be prevented.

Figure 17:
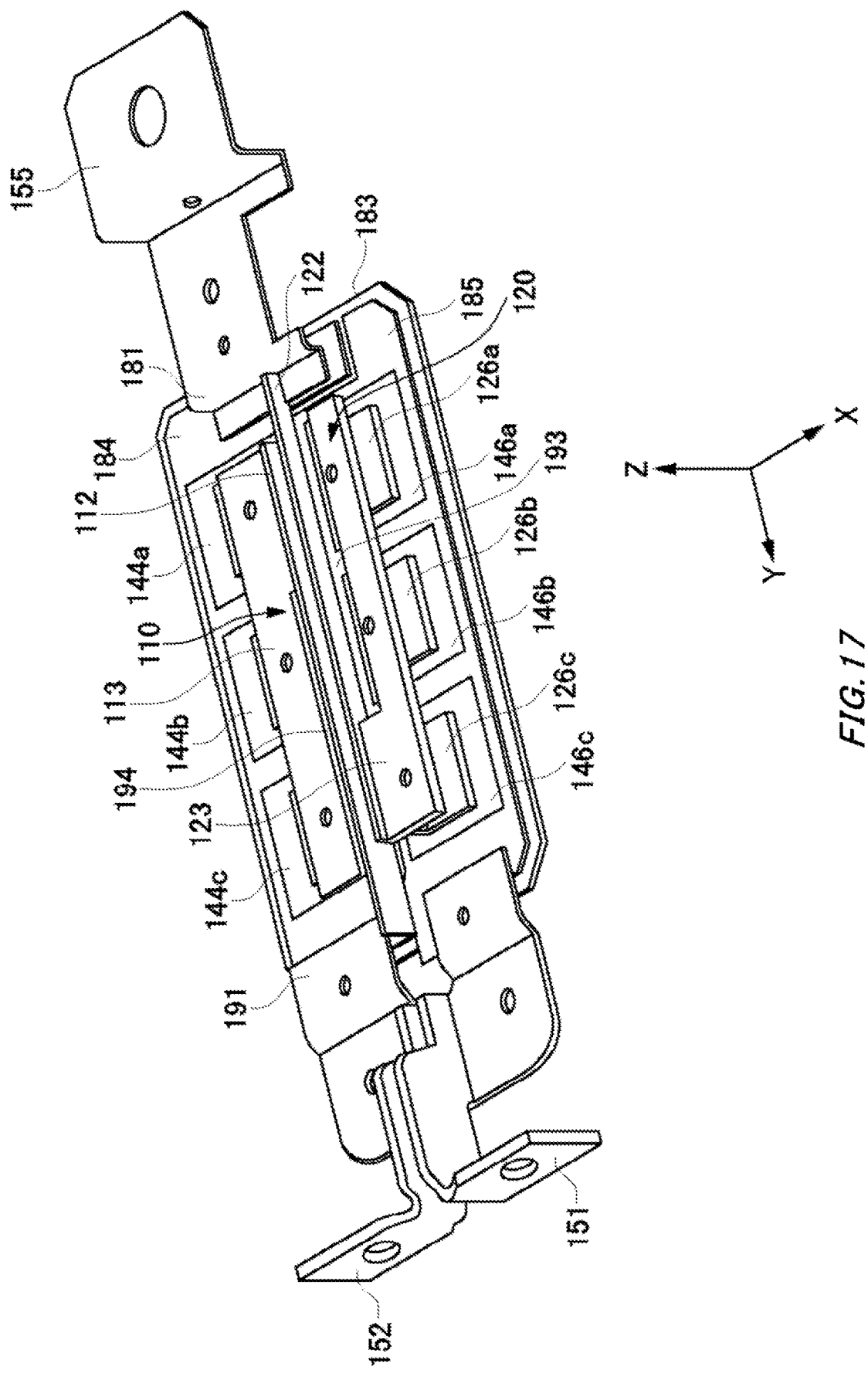
FIG. 17 shows an arrangement example of the first lead frame 110 and the second lead frame 120 each having a slit portion.
Figure 18:
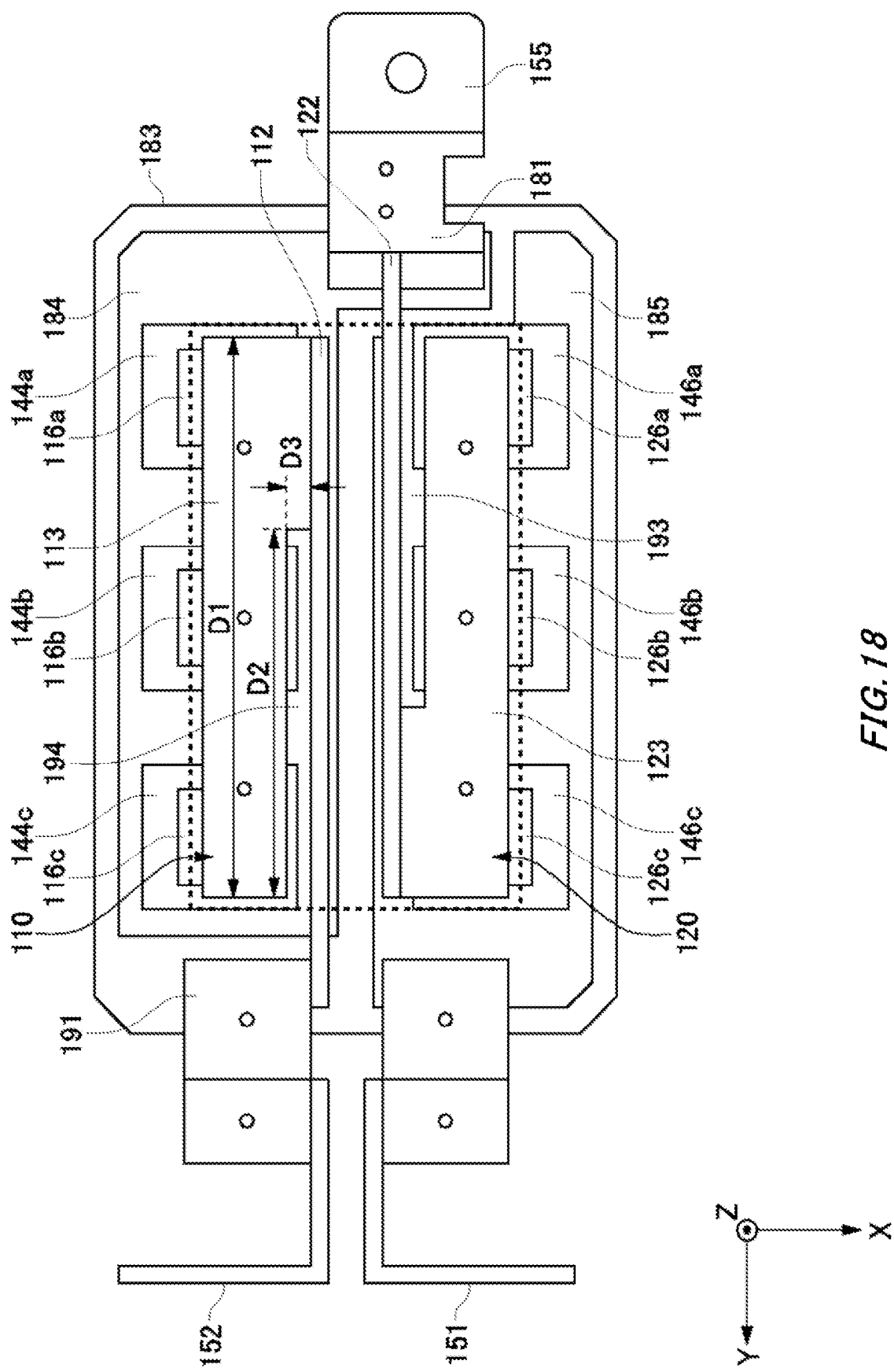
FIG. 18 shows one example of a top view of the first lead frame 110 and the second lead frame 120 each having the slit portion.

FIG. 17 shows an arrangement example of a first lead frame 110 and a second lead frame 120 each having a slit portion. FIG. 18 shows one example of a top view of the first lead frame 110 and the second lead frame 120 each having the slit portion.

The first lead frame 110 and the second lead frame 120 shown in FIG. 17 and FIG. 18 each have a surface arranged to face each other. In the present example, similarly to the case shown in FIG. 8, the first lead frame 110 has the extension portion 112. The extension portion 112 is formed to extend in the upward direction or the downward direction in the end side facing the second lead frame 120. The second lead frame 120 also comprises the extension portion 122. In the present example, the extension portion 112 and the extension portion 122 extends in the upward direction. The extension portion 112 of the first lead frame 110 and the extension portion 122 of the second lead frame 120 come close without being kept in contact with each other. In this way, low inductance can be attained by action of mutual inductance.

The first lead frame 110 extends in the longitudinal direction. The first lead frame 110 has a first intermediate portion 113 between both ends in the longitudinal direction. The second lead frame 120 also extends in the longitudinal direction. The second lead frame 120 has a second intermediate portion 123 between both ends in the longitudinal direction. The first intermediate portion 113 may include the plate-shaped portion 111 and the chip connection portion 116 as shown in FIG. 4 to FIG. 14, and further may include the facing portion 114 and so on. Similarly, the second intermediate portion 123 may include the plate-shaped portion 121 and the chip connection portion 126 as shown in FIG. 4 to FIG. 14, and further may include the facing portion 124 and so on.

In the present example, one end portion of the first lead frame 110 in the longitudinal direction (end portion in the +Y-axis direction) is connected to the N terminal 152 that is one of the main terminals through the terminal connection portion 191. In the present example, one end portion of the extension portion 112 in the longitudinal direction is connected to the N terminal 152 through the terminal connection portion 191. One end portion of the second lead frame 120 in the longitudinal direction (end portion in the −Y-axis direction) is connected to the U terminal 155a (or the V terminal 155b or the W terminal 155c) that is one of the main terminals through the terminal connection portion 181. In the present example, one end portion of the extension portion 122 in the longitudinal direction is connected to the U terminal 155a and so on through the terminal connection portion 191.

As shown in FIG. 18, a conductive plate 184 and a conductive plate 185 may be provided on an insulating substrate 183. The conductive plate 184 and the conductive plate 185 are electrically separated from each other. The plurality of semiconductor chips 144a, 144b and 144c that constitute the lower arm circuit 144 may be arrayed on the conductive plate 184 along the Y-axis. In the plurality of semiconductor chips 144a, 144b and 144c, the first intermediate portion 113 of the first lead frame 110 is connected to each emitter terminal of the respective IGBT 143a, the IGBT 143b and the IGBT 143c. Specifically, the plurality of chip connection portions 116a, 116b and 116c included in the first intermediate portion 113 may be connected to each emitter terminal of the IGBT 143a, the IGBT 143b and the IGBT 143c. The chip connection portions 116a, 116b and 116c may have a similar configuration to those shown in FIG. 4, FIG. 6 and FIG. 12 and so on.

In the plurality of semiconductor chips 144a, 144b and 144c, each collector terminal of the respective IGBT 143a, IGBT 143b and IGBT 143c is connected to the conductive plate 184 on the rear surface of the semiconductor chip. The conductive plate 184 is connected to the second lead frame 120. Through the second lead frame 120, the conductive plate 184 is electrically connected to each emitter terminal of the IGBT 147a, the IGBT 147b and the IGBT 147c in the plurality of semiconductor chips 146a, 146b and 146c that constitute the upper arm circuit 146, and to the U terminal 155a (or the V terminal 155b or the W terminal 155c) that is one of the main terminals.

The plurality of semiconductor chips 146a, 146b and 146c that constitute the upper arm circuit 146 may be arrayed on the conductive plate 185 along the Y-axis. The plurality of semiconductor chips 144a, 144b and 144c and the plurality of semiconductor chips 146a, 146b and 146c may be arrayed to face each other at different positions on the X-axis. In this regard, the semiconductor chips 144a, 144b and 144c and so on may not necessarily be arrayed in a line. In the plurality of semiconductor chips 146a, 146b and 146c, the second intermediate portion 123 of the second lead frame 120 is connected to each emitter terminal of the respective IGBT 147a, IGBT 147b and IGBT 147c. Specifically, the plurality of chip connection portions 126a, 126b and 126c included in the second intermediate portion 123 may be connected to each emitter terminal of the IGBT 147a, IGBT 147b and IGBT 147c. The chip connection portions 126a, 126b and 126c may have a similar configuration to those shown in FIG. 4, FIG. 7 and FIG. 12 and so on.

In the plurality of semiconductor chips 146a, 146b and 146c, each collector terminal of the respective IGBT 147a, IGBT 147b and IGBT 147c is connected to the conductive plate 185 on the rear surface of the semiconductor chip. The conductive plate 185 may be electrically connected to the P terminal 151 that is one of the main terminals. The P terminal 151 and the N terminal 152 may be arranged to end portions of the first lead frame 110 and the second lead frame 120 in a same direction (end portion in the +Y direction) without contacting with each other.

The first intermediate portion 113 of the first lead frame 110 and the second intermediate portion 123 of the second lead frame 120 face each other at an interval therebetween, and are also arranged to be point-symmetric about the middle of the interval in a top view. Note that the center of the point-symmetry may be a midpoint in the X direction of an interval between the first intermediate portion 113 of the first lead frame 110 and the second lead frame 120, and a midpoint in the Y-axis direction of an intermediate region shown by a dotted line in FIG. 18.

As shown in FIG. 18, in the first lead frame 110, a first slit portion 194 is formed along the longitudinal direction of the first lead frame 110. In the present example, in the first intermediate portion 113 of the first lead frame 110, the first slit portion 194 along the longitudinal direction (Y-axis direction) is formed. The first slit portion 194 may be formed to extend from one end side of the first intermediate portion 113 of the first lead frame 110 which is closer to the first main terminal (side located at an end portion in the +Y-axis direction) toward the other end side (side located at an end portion in the −Y-axis direction)(−Y-axis direction).

In the second lead frame 120, the second slit portion 193 is formed along the longitudinal direction of the second lead frame 120. In the present example, in the second intermediate portion 123 of the second lead frame 120, the second slit portion 193 along the longitudinal direction (Y-axis direction) is formed. The second slit portion 193 may be formed to extend from one end side of the second intermediate portion 123 of the second lead frame 120 which is closer to the second main terminal (side located at an end portion in the −Y-axis direction) toward the other end side (side located at an end portion in the +direction)(+Y-axis direction).

A length of the first slit portion 194 in a longitudinal direction and a length of the second slit portion 193 in a longitudinal direction each may be a same length D2. A length of the first slit portion 194 in a short direction and a length of the second slit portion 193 in a short direction each may be a same length D3. The length D2 may be longer than the length D3. The length D2 of the first slit portion 194 in the longitudinal direction may be one third or more of the length D1 of the first intermediate portion 113 in the first lead frame 110 in the longitudinal direction (Y-axis direction), may be one half or more thereof and may be longer than two thirds or more thereof. Similarly, the length D2 of the second slit portion 193 in the longitudinal direction may be one third or more of the length of the second intermediate portion 123 in the second lead frame 120 in the longitudinal direction, may be one half or more thereof and may be longer than two thirds or more thereof.

In the present example, the first slit portion 194 is provided at the plate-shaped portion in the first intermediate portion 113 to be in contact therewith along the side surface of the extension portion 112. The second slit portion 193 is provided at the plate-shaped portion in the second intermediate portion 123 to be in contact therewith along the side surface of the extension portion 122. In this regard, the first slit portion 194 may be provided apart by a predetermined distance in the X-axis direction from the side surface of the extension portion 112. The second slit portion 193 may be provided apart by a predetermined distance in the X-axis direction from the side surface of the extension portion 122.

The first intermediate portion 113 of the first lead frame 110 and the second intermediate portion 123 of the second lead frame 120, including formation positions and shapes of the first slit portion 194 and the second slit portion 193, are preferably arranged to be point-symmetric in a top view.

Figure 19:
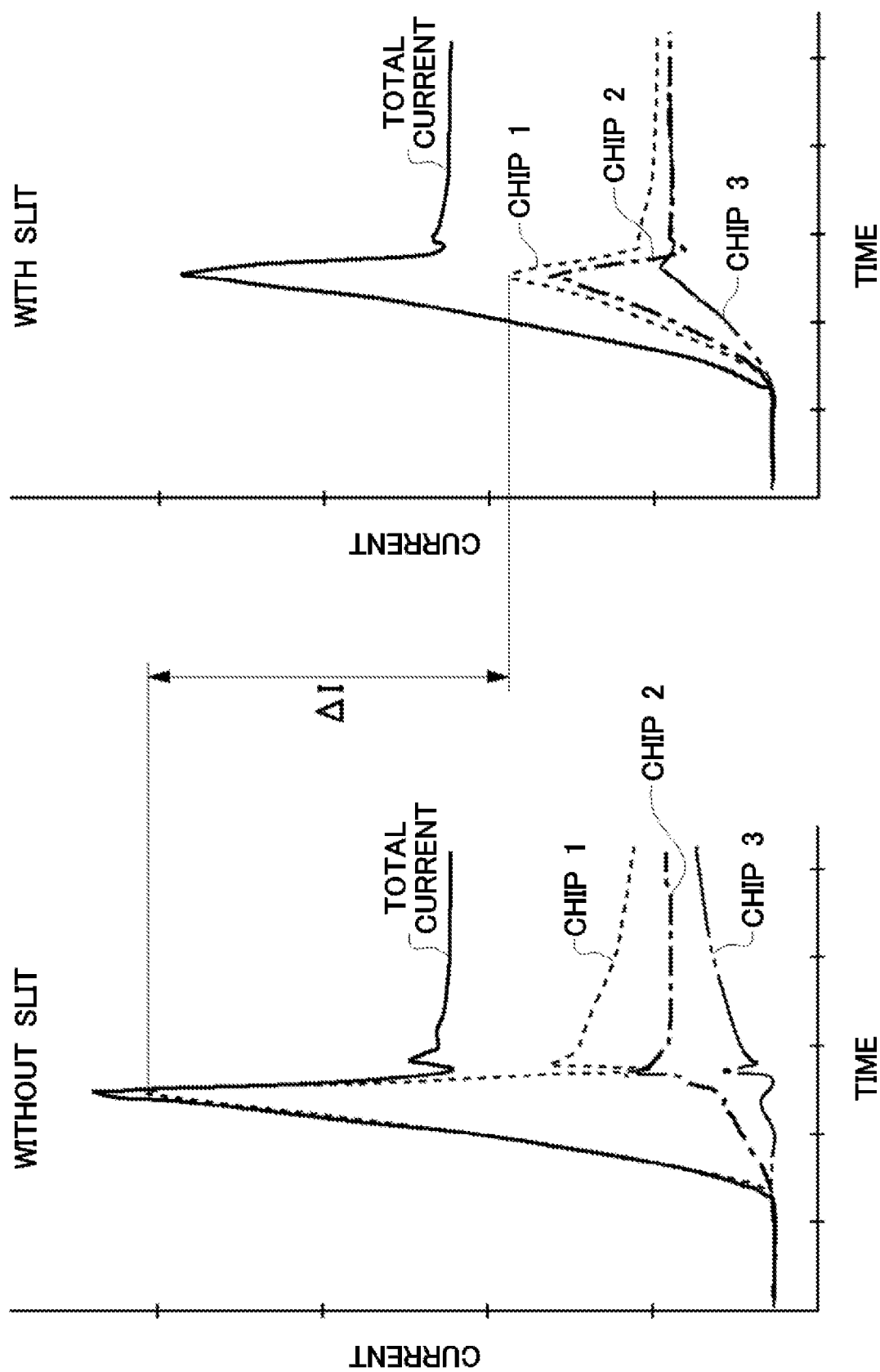
FIG. 19 shows a difference between current waveforms due to presence or absence of the slit portion.

An effect attained by providing the first slit portion 194 and the second slit portion 193 shown in FIG. 17 and FIG. 18 will be described. FIG. 19 shows a difference between current waveforms due to presence or absence of the slit portion. In the present example, each of currents that flows in the plurality of semiconductor chip 146a (chip 1), semiconductor chip 146b (chip 2) and semiconductor chip 146c (chip 3) that are included in the upper arm circuit 146, and a total current of these. In the present example, the chips are referred to as the chip 1, chip 2 and chip 3 in order from a side closer to the second main terminal (in the present example, the U terminal 155a) that is connected to the second lead frame 120.

In FIG. 19, graphs without slit show simulation results of current waveforms at the time of turn-on in a case where the first slit portion 194 and the second slit portion 193 in FIG. 17 and FIG. 18 are not formed. Graphs with slit show simulation results of current waveforms at the time of turn-on in a case where the first slit portion 194 and the second slit portion 193 in FIG. 17 and FIG. 18 are formed. In a case without slit and a case with slit, conditions of, for example, an application power supply voltage Vdd, a steady current Id, a gate resistance Rg and a joint temperature Tj are the same.

As shown in FIG. 19, a variation of currents that flow respectively in the semiconductor chip 146a (chip 1), the semiconductor chip 146b (chip 2) and the semiconductor chip 146c (chip 3) in a case where the first lead frame 110 and the second lead frame 120 have the first slit portion 194 and the second slit portion 193 is smaller than a variation of currents that flow respectively in the semiconductor chip 146a (chip 1), the semiconductor chip 146b (chip 2) and the semiconductor chip 146c (chip 3) in a case where the first lead frame 110 and the second lead frame 120 do not have the first slit portion 194 and the second slit portion 193.

According to the present example, in the case where the first slit portion 194 and the second slit portion 193 exist, a ratio of the currents that flow in the semiconductor chip 146a (chip 1), the semiconductor chip 146b (chip 2) and the semiconductor chip 146c (chip 3) is approximately 2.7:2:1. This shows a smaller variation of the currents as compared to a ratio of 10:1.25:1 that is a ratio of the currents that flow in the semiconductor chip 146a (chip 1), the semiconductor chip 146b (chip 2) and the semiconductor chip 146c (chip 3) in the case where the first slit portion 194 and the second slit portion 193 do not exist.

In the present example, the provision of the first slit portion 194 and the second slit portion 193 can suppress concentration of the currents on the specific semiconductor chip 146a (chip 1), as compared to the case where the first slit portion 194 and the second slit portion 193 do not exist. In the present example, the current that flows in the semiconductor chip 146a (chip 1) becomes the largest in the plurality of semiconductor chip 146a (chip 1), semiconductor chip 146b (chip 2) and semiconductor chip 146c (chip 3). Then, the current that flows in the semiconductor chip 146a (chip 1) is reduced by $\Delta I$ due to the provision of the first slit portion 194 and the second slit portion 193. In the present example, in a condition where the total steady current Id is set to 400 A, a peak current that flows in the semiconductor chip 146a (chip 1) could be reduced from 749 A to 324 A due to the provision of the first slit portion 194 and the second slit portion 193.

Figure 20:
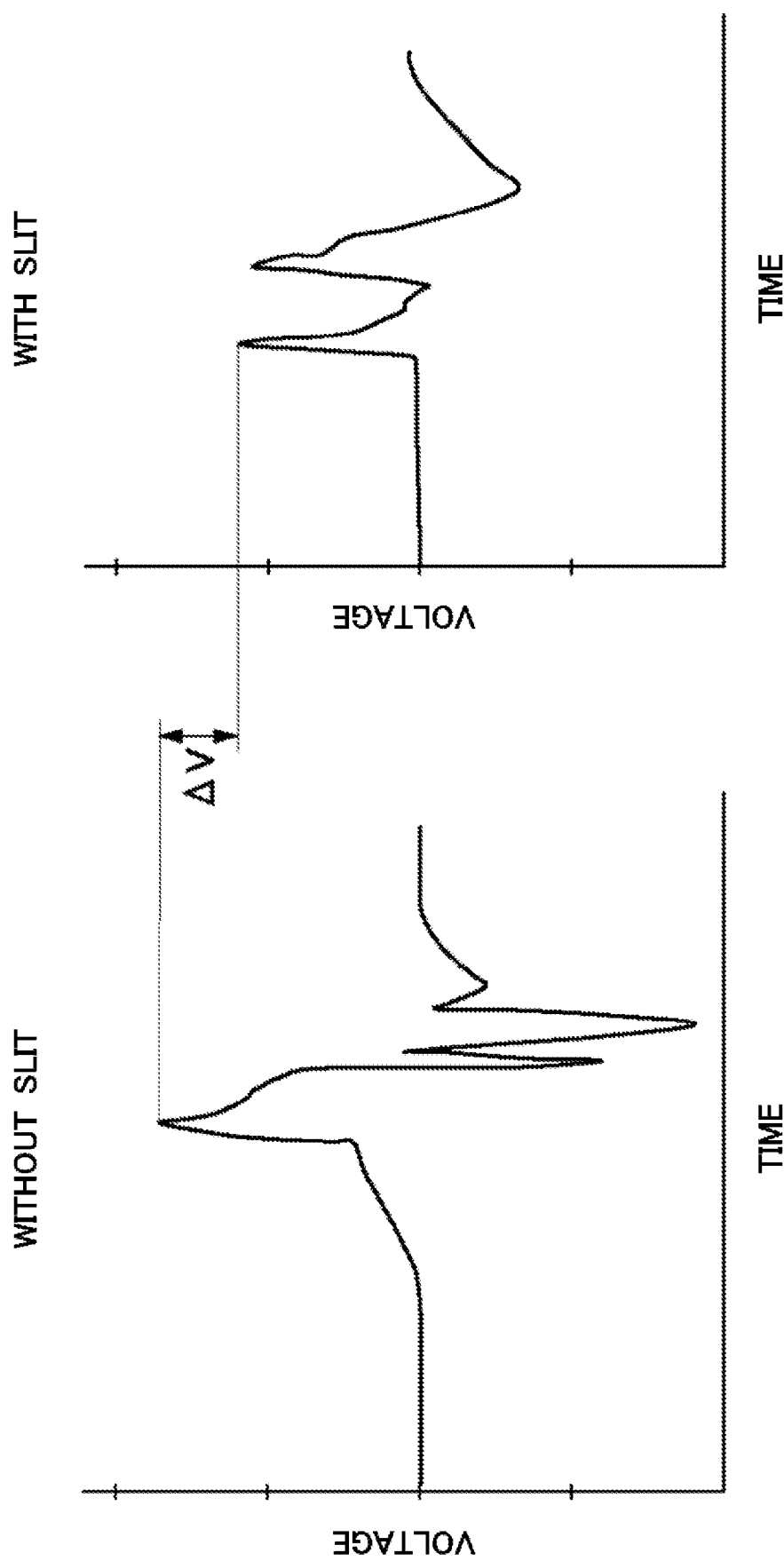
FIG. 20 shows differences between voltage waveforms in IGBTs at facing arms due to presence or absence of the slit portion.

FIG. 20 shows differences between voltage waveforms in IGBTs at facing arms due to presence or absence of the slit portion.

As mentioned above, the freewheeling diodes 145a, 145b and 145c of the facing arm (for example, the lower arm circuit 144) are reversely recovered. Then, with the reverse recovery, the gate voltages of the IGBTs 143a, 143b and 143c of the facing arm are increased. However, an increase of the gate voltages in the IGBTs 143a, 143b and 143c of the facing arm can be suppressed due to the provision of the first slit portion 194 and the second slit portion 193. In the present example, a peak of the gate voltage could be reduced from 9.1 V to 6.1 V due to the provision of the first slit portion 194 and the second slit portion 193.

Note that in the present example, the gate voltage of the IGBT 143c in the semiconductor chip 144c (chip 4) became the largest in the plurality of the semiconductor chips 144a (chip 6), 144b (chip 5) and 144c (chip 4) in the case where the first slit portion 194 and the second slit portion 193 are not provided. On the other hand, the gate voltage of the IGBT 143a in the semiconductor chip 144a (chip 6) became the largest in the plurality of the semiconductor chips 144a, 144b and 144c in the case where the first slit portion 194 and the second slit portion 193 are provided. In this regard, the gate voltage of the IGBT 143a could be reduced as compared to the largest gate voltage in the case where the first slit portion 194 and the second slit portion 193 are not provided.

Also with respect to self inductance, imbalance of values thereof in the semiconductor chips 146a, 146b and 146c was reduced by the provision of the first slit portion 194 and the second slit portion 193. In a structure where the first slit portion 194 and the second slit portion 193 are not provided, self inductances of the semiconductor chips 146a, 146b and 146c became 14.6 nH, 20.4 nH and 29.0 nH, respectively, and a ratio thereof became 1:1.4:2.0. By contrast, in a structure where the first slit portion 194 and the second slit portion 193 are provided, the self inductances of the semiconductor chips 146a, 146b and 146c became 40.7 nH, 33.9 nH and 33.6 nH, respectively, and a ratio thereof became 1.3:1:1. Accordingly, imbalance in the inductance from the emitters of the semiconductor chips 146a, 146b and 146c to the main terminals was improved.

Also with respect to effective inductance, imbalance thereof in the semiconductor chips 146a, 146b and 146c was reduced. The effective inductance is calculated by the sum of the self inductance and the mutual inductance. In the structure where the first slit portion 194 and the second slit portion 193 are not provided, the effective inductances in the semiconductor chips 146a, 146b and 146c became 10.2 nH, 18.1 nH and 23.8 nH, respectively, and a ratio thereof became 1:1.8:2.3. By contrast, in the structure where the first slit portion 194 and the second slit portion 193 are provided, the effective inductances of the semiconductor chips 146a, 146b and 146c became 15.0 nH, 15.1 nH and 14.2 nH, respectively, and a ratio thereof became 1.1:1.1:1. Accordingly, imbalance in the effective inductance from the emitters of the semiconductor chips to the main terminals was improved.

As describe above, according to the semiconductor module 100 of the present example, the first slit portion 194 is formed in the first lead frame 110, and the second slit portion 193 is formed in the second lead frame 120. In this way, imbalance of the inductance in the semiconductor chips 146a, 146b and 146c is reduced. Then, imbalance of the currents in the semiconductor chips 146a, 146b and 146c is reduced. When the freewheeling diodes 145a, 145b and 145c in the facing arm are reversely recovered, an increase of the gate voltages in the IGBTs 143a, 143b and 143c in the facing arm can be prevented. Accordingly, also erroneous turning-on of a specific semiconductor chip can be prevented.

Note that though the case where the upper arm circuit 146 is switched in the example described above, a case where the lower arm circuit 144 is switched is also similar. Imbalance of the inductances in the semiconductor chips 144a, 144b and 144c is reduced, and imbalance of the currents in the semiconductor chips 144a, 144b and 144c is reduced. When the freewheeling diodes 148a, 148b and 148c in the facing arm are reversely recovered, an increase of the gate voltages in the IGBTs 147a, 147b and 147c in the facing arm can be prevented.

Also the semiconductor module 100 in which the first slit portion 194 and the second slit portion 193 are formed as illustrated with reference to FIG. 16 to FIG. 20 may be used in the electric automobile 300 and the power control unit 200 shown in FIG. 15.

In the above, though the present invention is described with the embodiments, the configuration of the semiconductor module 100 is not limited to these cases. For example, as shown in FIG. 9, in the first lead frame 110, as for the configuration in which the facing portion 114 overlaps the plate-shaped portion 111 in a top view, a length of the facing portion 114 of the first lead frame 110 in the longitudinal direction and a length of the plate-shaped portion 111 may be adapted to be different from each other. For example, after the length of the facing portion 114 is made shorter, the facing portion 114 may be arranged only at a part that is close to one end portion of the first lead frame 110.

Similarly, even in the second lead frame 120, after the length of the facing portion 124 is made shorter, the facing portion 124 may be arranged only at a part of the second lead frame 120 that is close to an end portion on an opposite side from the one end portion of the first lead frame 110. Also in this case, the first intermediate portion 113 of the first lead frame 110 and the second intermediate portion 123 of the second lead frame 120 may be arranged to be point-symmetric about the middle of the interval in a top view. Imbalance of the inductances in the semiconductor chips 146a, 146b and 146c is reduced due to an arrangement position of the facing portion 114, the plate-shaped portion 111 or the like.

As shown in FIG. 8, the semiconductor module 100 having the plate-shaped portion 111 of the first lead frame 110 and the plate-shaped portion 121 of the second lead frame 120 may be utilized. In an edge opposite to a side at which the plate-shaped portion 111 faces the plate-shaped portion 121, an extension part that partially extends the plate-shaped portion 111 may be provided. Similarly, an extension part that the plate-shaped portion 121 partially extends the plate-shaped portion 121 may be provided. In this case, in a part that is the closest to the one end portion of the first lead frame 110, the extension part may be provided in the plate-shaped portion 111. In the second lead frame 120, in the part that is close to the end portion on the opposite side from the one end portion of the first lead frame 110, the extension part may be provided in the plate-shaped portion 121. Also in this case, the first intermediate portion 113 of the first lead frame 110 and the second intermediate portion 123 of the second lead frame 120 may be arranged to be point-symmetric about the middle of the interval in a top view. Imbalance of the inductances in the semiconductor chips 146a, 146b and 146c is reduced due to an arrangement position of the facing portion 114, the plate-shaped portion 111 or the like.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module comprising a first arm circuit and a second arm circuit, the semiconductor module comprising:
   a plurality of semiconductor chips included in each of the first arm circuit and the second arm circuit;
   a first lead frame connected to the plurality of semiconductor chips in the first arm circuit;
   a second lead frame connected to the plurality of semiconductor chips in the second arm circuit;
   a first main terminal connected to the first lead frame; and
   a second main terminal connected to the second lead frame,
   wherein each of the first lead frame and the second lead frame has a facing part,
   a first terminal connection portion connected to the first main terminal is provided at a first end portion of the first lead frame,
   a second terminal connection portion connected to the second main terminal is provided at a second end portion of the second lead frame, and
   the first terminal connection portion and the second terminal connection portion are arranged on opposite sides when viewed from the facing parts of the first lead frame and the second lead frame.

2. The semiconductor module according to claim 1, wherein a direction of a current that flows in the first lead frame when the plurality of semiconductor chips included in the first arm circuit are switched to an ON state is opposite to a direction of a current that flows in the second lead frame when the plurality of semiconductor chips included in the second arm circuit are switched to an ON state.

3. The semiconductor module according to claim 1, wherein a chip connection portion that is connected to the plurality of semiconductor chips in the first lead frame, and a chip connection portion that is connected to the plurality of semiconductor chips in the second lead frame are arranged in parallel to each other in a top view.

4. The semiconductor module according to claim 1, wherein the first lead frame has:
   a first plate-shaped portion; and
   a first extension portion that: is formed at an end side in the first plate-shaped portion at which the first plate-shaped portion faces the second lead frame; and extends in an upward direction or downward direction, and
   the second lead frame has:
   a second plate-shaped portion; and
   a second extension portion that: is formed at an end side in the second plate-shaped portion at which the second plate-shaped portion faces the first lead frame; and extends in a direction to face the first extension portion.

5. The semiconductor module according to claim 4, wherein the first lead frame further has a first facing portion in a plate shape that is connected to the first extension portion, and arranged to face the first plate-shaped portion.

6. The semiconductor module according to claim 4, wherein the second lead frame further has a second facing portion in a plate shape that is connected to the second extension portion, and arranged to face the second plate-shaped portion.

7. The semiconductor module according to claim 1, wherein the first lead frame has a first plate-shaped portion, and
   the second lead frame has:
   a second plate-shaped portion arranged not to overlap the first plate-shaped portion in a top view; and an overlapping portion connected to the second plate-shaped portion, and arranged to overlap the first plate-shaped portion in a top view.

8. The semiconductor module according to claim 7, wherein the first lead frame has:
   a first extension portion that is formed at an end side in the first plate-shaped portion at which the first plate-shaped portion faces the second lead frame; and extends in an upward direction or downward direction;
   a plate-shaped, first facing portion connected to the first extension portion, and arranged to face the first plate-shaped portion; and
   a plurality of first chip connection portions that connect the first plate-shaped portion or the first facing portion to the plurality of semiconductor chips.

9. The semiconductor module according to claim 7, wherein the second lead frame has a plurality of second chip connection portions that connect the second plate-shaped portion to the plurality of semiconductor chips.

10. The semiconductor module according to claim 7, wherein the second lead frame has a second extension portion that couples the second plate-shaped portion to the overlapping portion, and
   the second extension portion has a cutout formed to span from an end side thereof closer to the second main terminal to a position at which the cutout faces the semiconductor chip that is among the plurality of semiconductor chips and is closest to the second main terminal.

11. The semiconductor module according to claim 1, wherein the first lead frame has:
   a first plate-shaped portion connected to the first main terminal; and
   a plurality of chip connection portions that are connected to the plurality of semiconductor chips, and thinner than the first plate-shaped portion.

12. The semiconductor module according to claim 1, wherein in the first lead frame, the first terminal connection portion connected to the first main terminal is thicker than a chip connection portion connected to the plurality of semiconductor chips.

13. The semiconductor module according to claim 4, wherein the first lead frame has a plurality of first chip connection portions connected to the plurality of semiconductor chips, and the first extension portion is thicker than the plurality of first chip connection portions.

14. The semiconductor module according to claim 1, wherein the plurality of semiconductor chips include a plurality of reverse-conducting insulated gate bipolar transistors,
   the first lead frame has a first intermediate portion that is connected to emitter terminals of the plurality of semiconductor chips included in the first arm circuit,
   the second lead frame has a second intermediate portion that is connected to emitter terminals of the plurality of semiconductor chips included in the second arm circuit, and
   the first intermediate portion of the first lead frame faces the second intermediate portion of the second lead frame at an interval therebetween, and also arranged to be point-symmetric to the second intermediate portion about a middle of the interval in a top view.

15. The semiconductor module according to claim 14, wherein in the first lead frame, a first slit portion is formed along a longitudinal direction of the first intermediate portion of the first lead frame, and
   in the second lead frame, a second slit portion is formed along a longitudinal direction of the second intermediate portion of the second lead frame.

16. The semiconductor module according to claim 15, wherein a length of the first slit portion in a longitudinal direction is longer than two thirds of a length of the first intermediate portion in the first lead frame in the longitudinal direction, and
   a length of the second slit portion in a longitudinal direction is longer than two thirds of a length of the second intermediate portion in the second lead frame in the longitudinal direction.

17. The semiconductor module according to claim 15, wherein the first slit portion is formed to span from an end side of the first lead frame which is closer to the first main terminal, and
   the second slit portion is formed to span from an end side of the second lead frame which is closer to the second main terminal.

18. An electric automobile comprising the semiconductor module according to claim 1.

19. A power control unit comprising the semiconductor module according to claim 1.

* * * * *